(12) United States Patent
Johnsgard et al.

(10) Patent No.: US 6,902,622 B2
(45) Date of Patent: Jun. 7, 2005

(54) SYSTEMS AND METHODS FOR EPITAXIALLY DEPOSITING FILMS ON A SEMICONDUCTOR SUBSTRATE

(75) Inventors: Kristian E. Johnsgard, Los Gatos, CA (US); David E. Sallows, Union City, CA (US); Daniel L. Messineo, San Jose, CA (US); Robert D. Mailho, Sonora, CA (US); Mark W. Johnsgard, Campbell, CA (US)

(73) Assignee: Mattson Technology, Inc., Freemont, CA (US)

( * ) Notice: Subject to any disclaimer, the term of this patent is extended or adjusted under 35 U.S.C. 154(b) by 0 days.

(21) Appl. No.: 10/120,186

(22) Filed: Apr. 10, 2002

(65) Prior Publication Data

US 2003/0124820 A1 Jul. 3, 2003

(Under 37 CFR 1.47)

Related U.S. Application Data

(60) Provisional application No. 60/283,541, filed on Apr. 12, 2001.

(51) Int. Cl.$^7$ .................... C23C 16/00; C23C 16/455
(52) U.S. Cl. .................. 118/715; 118/666; 118/724; 118/725; 118/730; 156/345.27; 156/345.29; 156/345.33; 156/345.37; 156/345.52; 156/345.55
(58) Field of Search .................... 118/715, 666, 118/724, 725, 730; 156/345.27, 345.29, 345.33, 345.37, 345.52, 345.55

(56) References Cited

U.S. PATENT DOCUMENTS

| | | | |
|---|---|---|---|
| 4,694,779 A | | 9/1987 | Hammond et al. |
| 5,244,501 A | * | 9/1993 | Nakayama et al. ......... 118/725 |
| 5,269,847 A | | 12/1993 | Anderson et al. |
| 5,334,277 A | * | 8/1994 | Nakamura .................. 117/102 |
| 5,455,070 A | | 10/1995 | Anderson et al. |
| 5,484,486 A | * | 1/1996 | Blackburn et al. .......... 118/728 |
| 5,522,934 A | | 6/1996 | Suzuki et al. |
| 5,525,157 A | * | 6/1996 | Hawkins et al. ............ 118/715 |

(Continued)

FOREIGN PATENT DOCUMENTS

WO    WO 0145501A2 A3    6/2001

OTHER PUBLICATIONS

"Expitaxt", Chapter 3 of Chang and Sze, *ULSI Technology*, McGraw Hill, New York (1996), Pei–Jih Wang, pp. 105–143.

PCT Search Report, Oct. 17, 2002.

*Primary Examiner*—Jeffrie R. Lund
(74) *Attorney, Agent, or Firm*—Dority & Manning, P.A.

(57) ABSTRACT

Systems and methods for epitaxial deposition. The reactor includes a hot wall process cavity enclosed by a heater system, a thermal insulation system, and chamber walls. The walls of the process cavity may comprises a material having a substantially similar coefficient thermal expansion as the semiconductor substrate, such as quartz and silicon carbide, and may include an isothermal or near isothermal cavity that may be heated to temperatures as high as 1200 degrees C. Process gases may be injected through a plurality of ports, and are capable of achieving a fine level of distribution control of the gas components, including the film source gas, dopant source gas, and carrier gas. The gas supply system includes additional methods of delivering gas to the process cavity, such as through temperature measurement devices, and through a showerhead.

23 Claims, 16 Drawing Sheets

U.S. PATENT DOCUMENTS

| | | | |
|---|---|---|---|
| 5,551,985 A | * 9/1996 | Brors et al. | 118/725 |
| 5,571,329 A | * 11/1996 | Chan et al. | 118/715 |
| 5,653,808 A | * 8/1997 | MacLeish et al. | 118/715 |
| 5,725,673 A | * 3/1998 | Anderson et al. | 118/715 |
| 5,772,771 A | * 6/1998 | Li et al. | 118/723 L |
| 5,830,277 A | * 11/1998 | Johnsgard et al. | 118/725 |
| 5,874,711 A | 2/1999 | Champetier et al. | |
| 5,879,459 A | 3/1999 | Gadgil et al. | |
| 5,916,369 A | * 6/1999 | Anderson et al. | 118/715 |
| 5,930,456 A | 7/1999 | Vosen | |
| 5,960,158 A | 9/1999 | Gat et al. | |
| 5,970,214 A | 10/1999 | Gat | |
| 5,970,382 A | 10/1999 | Shah | |
| 5,973,447 A | 10/1999 | Mahoney et al. | |
| 5,993,555 A | * 11/1999 | Hamilton | 118/715 |
| 5,997,175 A | 12/1999 | Champetier et al. | |
| 6,001,175 A | 12/1999 | Maruyama et al. | |
| 6,027,244 A | 2/2000 | Champetier et al. | |
| 6,034,357 A | 3/2000 | Guardado | |
| 6,056,434 A | 5/2000 | Champetier | |
| 6,056,823 A | * 5/2000 | Sajoto et al. | 118/715 |
| 6,075,922 A | 6/2000 | Tay et al. | |
| 6,113,984 A | 9/2000 | MacLeish et al. | |
| 6,139,641 A | 10/2000 | Inokuchi et al. | |
| RE36,957 E | * 11/2000 | Brors et al. | 118/725 |
| 6,160,242 A | 12/2000 | Guardado | |
| 6,174,651 B1 | 1/2001 | Thakur | |
| 6,200,023 B1 | 3/2001 | Tay et al. | |
| 6,200,634 B1 | 3/2001 | Johnsgard et al. | |
| 6,204,484 B1 | 3/2001 | Tay et al. | |
| 6,210,484 B1 | 4/2001 | Hathaway | |
| 6,222,990 B1 | 4/2001 | Guardado et al. | |
| 6,223,684 B1 | 5/2001 | Fujioka et al. | |
| 6,281,141 B1 | 8/2001 | Das et al. | |
| 6,293,696 B1 | 9/2001 | Guardado | |
| 6,310,328 B1 | 10/2001 | Gat | |
| 6,359,263 B2 | 3/2002 | Tay et al. | |
| 6,403,923 B1 | 6/2002 | Tay et al. | |
| 6,413,884 B1 | 7/2002 | Moriyama | |
| 6,500,266 B1 | * 12/2002 | Ho et al. | 118/730 |
| 6,514,876 B1 | 2/2003 | Thakur et al. | |
| 6,559,424 B2 | 5/2003 | O'Carroll et al. | |
| 6,562,720 B2 | * 5/2003 | Thilderkvist et al. | 438/695 |
| 6,610,967 B2 | 8/2003 | Gat | |
| 6,638,876 B2 | 10/2003 | Levy et al. | |
| 6,646,235 B2 | * 11/2003 | Chen et al. | 219/444.1 |
| 6,666,921 B2 | * 12/2003 | Sakai et al. | 118/715 |
| 2002/0005400 A1 | 1/2002 | Gat | |
| 2002/0017618 A1 | 2/2002 | Gat et al. | |
| 2002/0104619 A1 | 8/2002 | Koren et al. | |
| 2002/0137311 A1 | 9/2002 | Timans | |
| 2003/0029859 A1 | * 2/2003 | Knoot et al. | 219/483 |
| 2003/0031793 A1 | 2/2003 | Chang et al. | |
| 2003/0124820 A1 | * 7/2003 | Johnsgard et al. | 438/482 |
| 2003/0209326 A1 | 11/2003 | Lee et al. | |
| 2003/0235983 A1 | 12/2003 | Li et al. | |
| 2003/0236642 A1 | 12/2003 | Timans | |

* cited by examiner

SYSTEMS AND METHODS FOR EPITAXIALLY DEPOSITING FILMS ON A SEMICONDUCTOR SUBSTRATE

RELATED APPLICATIONS

The present application is based on and claims priority to a provisional application filed on Apr. 12, 2001, having U.S. Ser. No. 60/283,541.

BACKGROUND OF THE INVENTION

The present invention relates in general to the processing of semiconductor substrates, and more particularly, to improved systems and methods for epitaxially depositing films onto a semiconductor substrate.

Processes utilizing epitaxial deposition generally involve the growth of one or more layers or films onto a semiconductor substrate. The growth of these layers is carefully controlled by the underlying processes and equipment to produce layers having the desired physical, electrical and mechanical characteristics. These characteristics typically include, for example, the growth rate and thickness of the epitaxial layer, resistivity, dopant concentration, doping transition width, defect density, level of metal and particle contamination, and slip. Because these characteristics are highly dependent upon the operating conditions (e.g., temperature, gas flow rate and concentration of process gases) under which the epitaxial layers are grown, the underlying processes and equipment must maintain precise control over these operating conditions in order to produce epitaxial layers having uniform characteristics over the entire surface of the semiconductor substrate. Maintaining the required level of control, however, has proven increasingly difficult to achieve due to the recent transition from 200 mm to 300 mm fabrication processes, the tighter process specifications imposed by many semiconductor manufacturers and the higher throughput requirements (the number of substrates processed per unit of time) necessary for cost-effective manufacturing. In light of these increased processing demands, maintaining the necessary level of control while simultaneously satisfying throughput requirements, has proven increasingly difficult to achieve using conventional epitaxial deposition approaches.

Referring to FIG. 1, an exemplary reactor for performing epitaxial deposition in accordance with an existing approach is illustrated generally at 100. The exemplary reactor consists of a quartz bell-shaped jar 101 which encloses a semiconductor substrate 102 and isolates the substrate 102 from outside contaminants. The bell-shaped jar 101 also encloses a susceptor 103 which is used to support and rotate the semiconductor substrate 102 during processing. The process gases used to deposit epitaxial layers are injected into the reactor through a gas inlet port 104 and are exhausted out of the reactor through an exhaust port 110 located at the opposite end of the reactor. In order to heat both the semiconductor substrate 102 and process gases to operating temperature, a number of quartz halogen lamps 112 are positioned around the upper portion of the bell-shaped jar 101 to radiate energy into the reactor through the transparent walls of the bell-shaped jar 101. An optical pyrometer 113 located above a small window 114 in the reactor wall detects the temperature of the reactor. The optical pyrometer 113 relays the temperature measurements to appropriate lamp control circuitry (not shown) which then increases or decreases the output of the halogen lamps 112 in response to the detected temperature of the reactor.

In operation, the exemplary reactor of FIG. 1 deposits an epitaxial layer on the semiconductor substrate 102 by injecting process gases into the bell-shaped jar 101 via the gas inlet port 104. These process gases typically include a silicon source gas, such as silicon tetrachloride ($SiCl_4$), trichlorosilane ($SiHCl_3$), and dichlorosilane ($SiH_2Cl_2$), and a carrier gas, such as hydrogen. The process gases may also include n-type dopants or p-type dopants, which may be provided by precursor gases such as arsine ($AsH_3$), and phophine ($PH_3$) or diborane ($B_2H_6$). The gas inlet port 104 directs a gas stream 105 of the process gases horizontally toward the semiconductor substrate 102. As the gas stream 105 approaches and passes over the semiconductor substrate 102, the relatively large volume of the bell-shaped jar 101 causes the gas stream 105 to split into a laminar flow 106, which flows across the surface of the substrate 102, and the naturally circulating flow 107 which fills the upper portion of the bell-shaped jar 101. The flow can be laminar or turbulent, depending on the temperature gradient and characteristic length (from susceptor surface to top surface of chamber enclosure). A boundary layer 108 is also produced above the surface of the semiconductor substrate 102 due to the velocity gradient between the laminar flow 106 and the relatively stationary (although rotating) semiconductor substrate 102.

As the laminar flow passes over the semiconductor substrate 102, some of reactants diffuse through the boundary layer 108 to adsorb on the surface of semiconductor substrate 102. Once adsorbed, the reactants 115 undergo surface diffusion to find an appropriate lattice site 116 on the growing single crystal film. This surface diffusion step requires energy, and is an important factor that determines the quality of the resulting epitaxial layer. If the surface energy is insufficient for a reactant to become accommodated at a lattice site before additional atoms have accumulated over it, undesirable defects in the crystal lattice will occur. The reactants 115 also react chemically with the surface of the semiconductor substrate 102 to form by-products 117, which desorb from the surface and diffuse through the boundary layer 108 back into the laminar flow 106 and are then removed from the reactor through the exhaust port 110.

Conventional epitaxial reactors, such as the reactor illustrated in FIG. 1, suffer from several deficiencies which may prevent these reactors from providing an effective and cost-efficient solution for various applications. One problem is that the bell-shaped jar 101 has a relatively large volume which inhibits the ability of the reactor to precisely control the processing temperature of the semiconductor substrate 102 and the process gases. As mentioned previously, the operating temperature of the semiconductor substrate 102 and process gases is a critical factor in achieving the desired physical, electrical and mechanical characteristics. If the temperature is too low, the reactants will have insufficient energy to become accommodated at an appropriate lattice site, which may result in an increase in the defect density within the crystal lattice. If the temperature is too high, in the case of $SiH_4$ or $Si_2H_6$, silicon molecules will bond together to form silicon aggregates in the vapor phase. These silicon aggregates can then fall to the surface of the substrate 102 and interfere with single crystal growth. Although it would be desirable to reduce the volume of the bell-shaped jar 101, the ability to do so may be limited by structural integrity constraints of the reactor.

Another problem relates to the ability of existing reactors to control the flow and concentration of process gases over the surface of the semiconductor substrate 102. As the laminar flow 106 of FIG. 1 passes over the semiconductor substrate 102, reactants within the process gases will be steadily depleted so that the laminar flow 106 will have a lower concentration of reactants near the exhaust port 110 than near the gas inlet port 104. Although the affects of depleted reactant concentration can be reduced for the perimeter of the semiconductor substrate 102 by rotating the semiconductor substrate 102 during processing, the depleted reactant concentration over the inner portion of the semiconductor substrate are not adequately addressed by the gas flow system of FIG. 1. Consequently, the semiconductor substrate 102 will have a greater thickness and a lower resistivity around the peripheral portion of the semiconductor substrate 102 than the inner portion of the semiconductor substrate 102.

Yet another problem involves the potential for build-up of a low quality silicon film on the walls of the bell-shaped jar 101. Designers of so-called "cold-wall" reactors typically expend substantial effort to maintain the temperature of reactant gases high enough for reaction to occur, and, simultaneously maintain the temperature of bell-shaped jar 101 low enough to avoid the deposition of an amorphous, low quality silicon film on its walls. If the walls get too hot, however, silicon molecules will adhere not only to the semiconductor substrate 102, but also form a thin film on the quartz walls of the reactor. This undesired, low quality film can tint the bell-shaped jar 101 and cause a variety of problems. Because the amorphous silicon adheres poorly to the quartz bell-shaped jar 101, and because there is mismatch in thermal expansion coefficients of silicon and quartz, the silicon has a tendency to flake off the quartz walls when the reactor is cooled. The amorphous silicon can also flake off the quartz walls during processing and fall onto the semiconductor substrate 102 thereby producing particulate contamination. The tinted bell-shaped jar 101 also reduces the amount of energy that can pass through it from the halogen lamps 112. Additionally, amorphous silicon may coat window 114, which causes optical pyrometer 113 to receive less light energy than it otherwise would have. The optical pyrometer 113 will then erroneously detect that the wafer temperature is cooler than it should be, and will instruct the halogen lamps 112 to deliver more energy, leading to even more unwanted deposition on the bell-shaped jar 112. As a result, it is frequently necessary to etch these deposits off of the bell-shaped jar with HCl after each semiconductor substrate is processed, which decreases the throughput of the reactor.

Therefore, in light of the deficiencies of the prior art and the increasing importance of epitaxial deposition in a variety of integrated circuit technologies, such as bipolar junction transistor (BJT) and complimentary metal oxide semiconductor (CMOS) technologies, there is a need for improved systems and methods for depositing epitaxial layers on a semiconductor substrate.

SUMMARY OF THE INVENTION

Embodiments of the present invention provide improved systems and methods for increasing the quality and throughput of semiconductor substrates. In accordance with aspects of the present invention, an epitaxial reactor is configured to include a hot wall process cavity enclosed by a heater system, a thermal insulation system, and chamber walls. One of the walls enclosing the process cavity includes a slit through which a semiconductor substrate may be inserted within, and extracted out of, the process cavity without requiring cooling of the process chamber. The walls of the process cavity may also comprise a material, such as quartz or silicon carbide, that has thermal properties substantially similar that of the semiconductor substrate. In this context, the walls of the process chamber may be heated to a temperature within 200° C. of the semiconductor substrate, particularly to a temperature within 100° C. of the semiconductor substrate, while the semiconductor substrate is being heated. In one embodiment, for instance, the walls of the process chamber may be heated to approximately the processing temperature of the semiconductor substrate.

By using a hot wall processing chamber, during the formation of layers containing silicon, molecules adhering to the surface of the walls form metallic silicon instead of amorphous silicon. This metallic silicon is more stable than the amorphous silicon film that typically forms on the walls of cold wall reactors, thereby enabling a reactor incorporating the principles of the present invention to successively process multiple semiconductor substrates without requiring cleaning of the reactor walls between each processing cycle. As a result, embodiments of the present invention may be used to provide high throughput epitaxial deposition within a stable thermal environment and may avoid the use of complex and expensive lamp systems. The process cavity may also have a relatively small volume which restricts the thickness of the boundary layer and allows a more efficient exchange of reactants with reaction by-products through the boundary layer to the substrate.

The reactor may also include a gas supply system that injects process gases into the process chamber through a plurality of gas inlet ports. The flow rate and/or concentration of each of the plurality of inlet ports may be controlled individually or in groups to selectively control the flow of process gases over, for example, the edge, middle and center zones of the semiconductor substrate. The gas supply system may also control the flow rate of each of a plurality of exhaust ports to selectively control the flow of process gases over the semiconductor substrate, either alone or in combination with the selective control of the gas inlet ports.

Alternatively, the gas flow system may incorporate a shower head in an upper portion of the process chamber to direct process gases down towards the surface of the substrate, thereby reducing the boundary layer. Another alternative for reducing the boundary layer involves shaping the upper wall of the process cavity to form a recessed or bowl-shaped portion within the process cavity. The gas supply system may further include additional methods of delivering gas to the process cavity, such as through apertures used for temperature measurement devices. Also, because the exemplary reactor includes a hot wall process cavity, and because the heat source of the exemplary reactor is internal to the processing chamber and is not transmitted through a clear quartz jar, this reactor chamber may be configured to efficiently and effectively use silane as a silicon source gas.

In one embodiment of the present invention, the gas inlets that are used to feed gas into the chamber include a longitudinal section and a lateral section. The longitudinal section can extend into the chamber from the bottom of the chamber or from the top of the chamber. The lateral section, on the other hand, can be configured to direct the flow of gases over the surface of the wafer. In this arrangement, the gases flow in generally a vertical direction into the chamber and then are directed horizontally across the wafer. Further, the lateral section can be configured to plenumize the flow of gases over the surface of the wafer.

In one particular embodiment, the longitudinal section of the gas inlets can be positioned adjacent to a heating device, such as an electrical resistance heater that is used to heat the chamber. In this manner, the gases flowing through the gas inlets are preheated prior to being exposed to the wafer.

The lateral sections of each of the gas inlets can be in communication with a support ring defining a common plenum. The plenum can be used to spread the gases over the entire surface of the wafer. Similarly, this system can include an exhaust system positioned on the opposite side of the wafer from the gas inlets. The exhaust system can include an exhaust ring for exhausting gases from the chamber. The exhaust ring can be in communication with multiple gas exhaust outlets. In one embodiment, the system can include at least five gas inlets and at least five gas outlets.

The processing chamber can include a heating device for heating the chamber and any semiconductor substrates contained within the chamber. In one embodiment, the heating device can comprise a cage-like heating system. The cage-like heating system can include a top resistive heater, a bottom resistive heater, and at least one side resistive heater. In one embodiment, the longitudinal sections of the gas inlets can be positioned adjacent to at least one of the resistive heaters. In this manner, gases are preheated prior to contacting the semiconductor wafer.

In another embodiment of the present invention, the lift pin mechanism that raises a substrate off a susceptor is capable of rotating with the susceptor during processing. This ability to rotate the lift pins with the susceptor eliminates the difficulty and risk of lift pin breakage associated with stopping the rotation of the susceptor so that the lift pins are in alignment relative to corresponding holes in the susceptor. This embodiment also increases throughput by reducing the amount of time necessary to extract substrates from the process cavity due to avoidance of the time spent homing the rotation to normally stationary pins.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

Aspects of the present invention provide improved systems and methods for processing semiconductor substrates. An exemplary embodiment of the present invention provides a stable, hot-walled thermal environment for epitaxial or potentially any other thermal CVD deposition on semiconductor wafers. An insulated processing cavity is formed from opaque quartz walls and a rotating susceptor and may enclose or be surrounded by a resistive heating system. The walls thermally insulate the processing cavity from the cooler surrounding environment and provide a relatively uniform and stable thermal processing environment. The processing environment may also be maintained at vacuum pressure to increase insulation and the stability of the thermal environment. Wafers are inserted through a narrow slot into the processing environment and onto pins which lower the wafer on the heated susceptor. The wafer is rotated on a susceptor and a silicon deposing gas is flowed across the surface of the wafer. The processing cavity is relatively compact which improves process efficiency and control. While deposits may form on the hot walls of the processing cavity, the deposits tend to be metallic silicon which is relatively stable. After processing, the wafer is raised on the pins and removed from the cavity. The processing cavity may be enclosed within the processing chamber that has an aligned slot or port, so the wafer may be inserted into and removed from the processing cavity and chamber laterally in a single motion along the same horizontal plane. The processing cavity may be maintained at a high temperature during both insertion and removal. Thus, a very high throughput may be attained with a stable thermal environment and without requiring complex lamp systems or heating up and cooling down a cold-wall processing environment for each wafer that is processed.

An additional advantage of this embodiment is its ability to process a variety of different sizes and shapes of semiconductor substrates. In a cold-wall lamp system, the lamps and the temperature control system may need to be substantially reconfigured for substrates of different sizes, but the stable thermal environment of the above embodiment allows different sizes to be accommodated relatively easily. Although the reactor may be specifically designed to process 300 mm diameter silicon wafers, it may permit 200 mm, 150 mm, and 125 mm silicon wafers to be processed as well. The ability to process a variety of different sized wafers may reduce the cost of ownership. The reactor may act as a "bridge tool," bridging a manufacturer's transition from one sized substrate to another. A chip manufacturing facility that is not yet ready to transition to 300 mm substrates, for example, may still use the tool to process 200 mm substrates. Once the size conversion is ultimately implemented, the manufacturer may avoid having to purchase an entirely new system.

Figure 2:
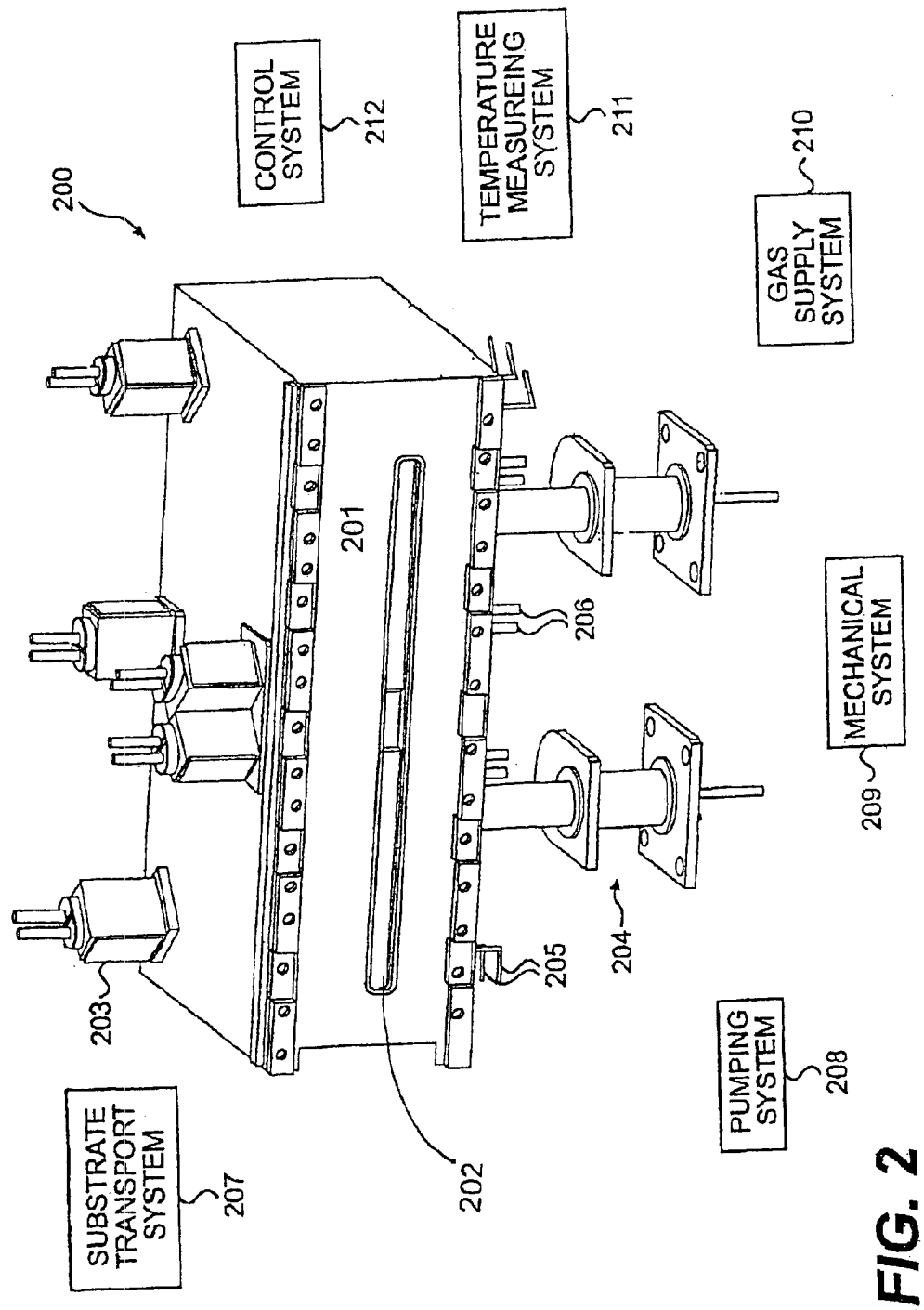
FIG. 2 illustrates an exemplary reactor system in which the principles of the present invention may be advantageously practiced.

Referring to FIG. 2, an exemplary system in which the principles of the present invention may be advantageously practiced is illustrated. The structural parts of the exemplary system include processing chamber for enclosing and a process cavity, where the process cavity has a susceptor (which could also be described as a substrate support plate) and a hood forming the bottom and top of the cavity, respectively. Heaters enclose the process cavity at the top and bottom, and along the sides at certain locations, depending on how many substrates are being processed and the desired heat transfer characteristics. Outside the heaters are chamber liners that provide thermal insulation and protection from contamination from the chamber walls, and finally, the chamber walls themselves. Within the heater-cage structure, and adjacent to and below the susceptor, is positioned a lift pin support plate assembly responsible for raising the substrate off the susceptor. Also enclosed in this region is a central post (and related hardware) for raising and lowering the susceptor into positions in the process cavity, and adjacent to the transfer port. Process gases are injected into the process cavity and exhausted out of process cavity by a gas supply system. In light of this overview of the exemplary system, a more detailed description of the components of the exemplary system, rotating lift pin support structure, heating system and gas inject system will now be provided.

As illustrated in FIG. 2, the exemplary system includes an epitaxial deposition reactor, depicted generally at 200, having a front plate 201 that may be mated with the robotic wafer transfer chamber of a substrate transport system 207. An exemplary substrate transport system is the Aspen III system available from Mattson Technology, Inc. The horizontal slit 202 in the middle of front plate 201 is the port through which wafers are transferred into and out of reactor 200 from the transfer chamber of the wafer handling system 207. The reactor 200 also includes electrical feedthroughs 203 at the top of the reactor 200, and susceptor manipulating equipment 204 at the bottom of the chamber. Gas supply inlets 205 are provide at a bottom portion of the chamber. The processing chamber further comprises a process cavity surrounded by at least one layer of insulating shields, which in turn are surrounded by the processing chamber walls.

The epitaxial reactor 200 is further coupled to a gas supply system 210 for receiving process gases into the reactor 200, a pumping system or atmospheric exhaust line 208 for exhausting gases from the reactor 200, a wafer transport system 207 for inserting and removing wafers, a mechanical system 209 for manipulating the susceptor, and a control system 212 for controlling and monitoring the operation of the reactor 200 and the foregoing subsystems as well as peripheral equipment such as optical pyrometers and other temperature measuring devices of the temperature control system 210.

Figure 3:
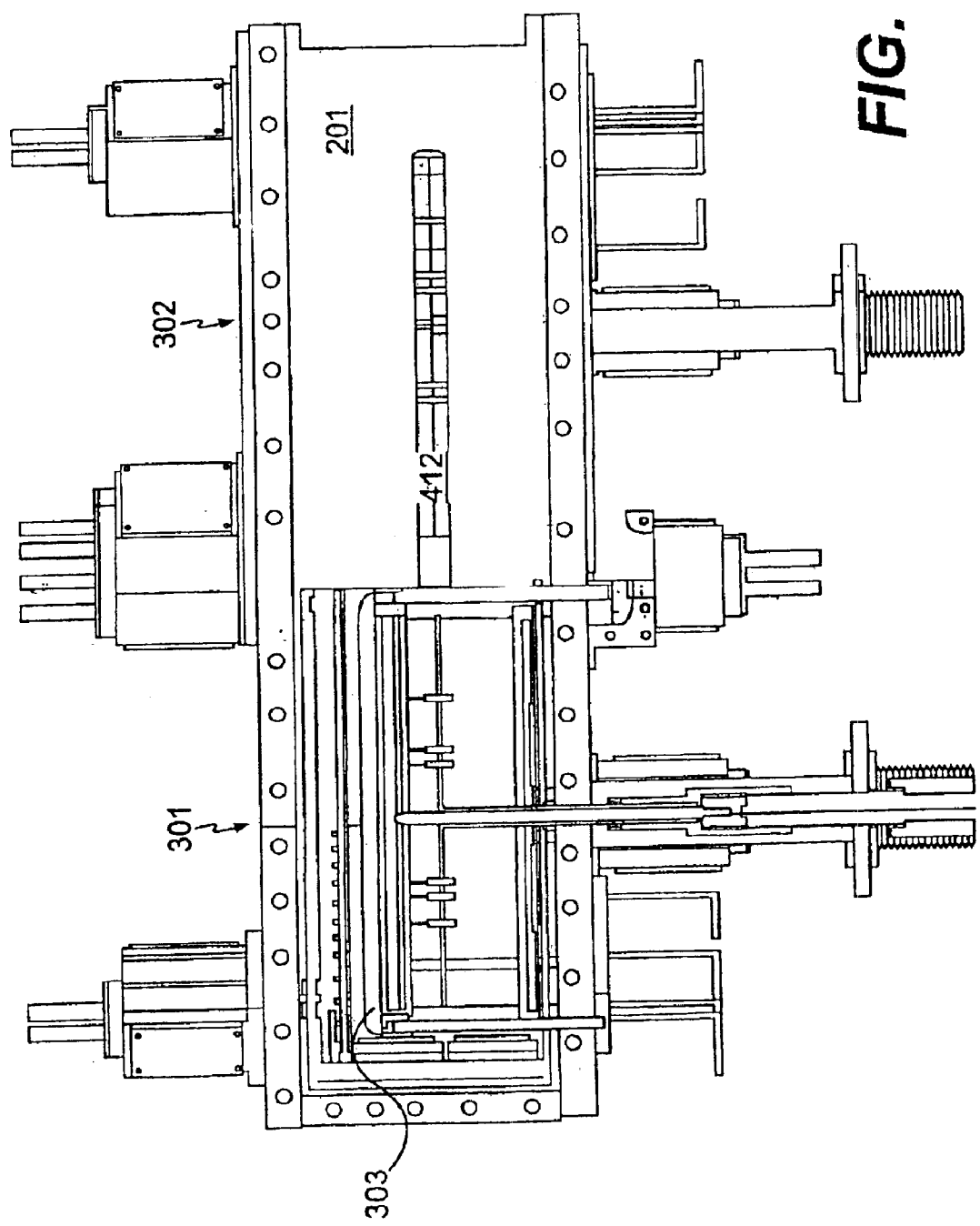
FIG. 3 illustrates a side-view of an exemplary reactor, with the interior of the left-hand portion exposed.

Referring to FIG. 3, the exemplary reactor of FIG. 2 is illustrated in cross-section, where front plate 201 has been removed from the left-hand portion 301 of the reactor 200 to reveal the interior of left-hand portion 301. The exposed, left-hand portion 301 is essentially mirrored on the right-hand side 302, which is still covered by front plate 201.

Figure 4:
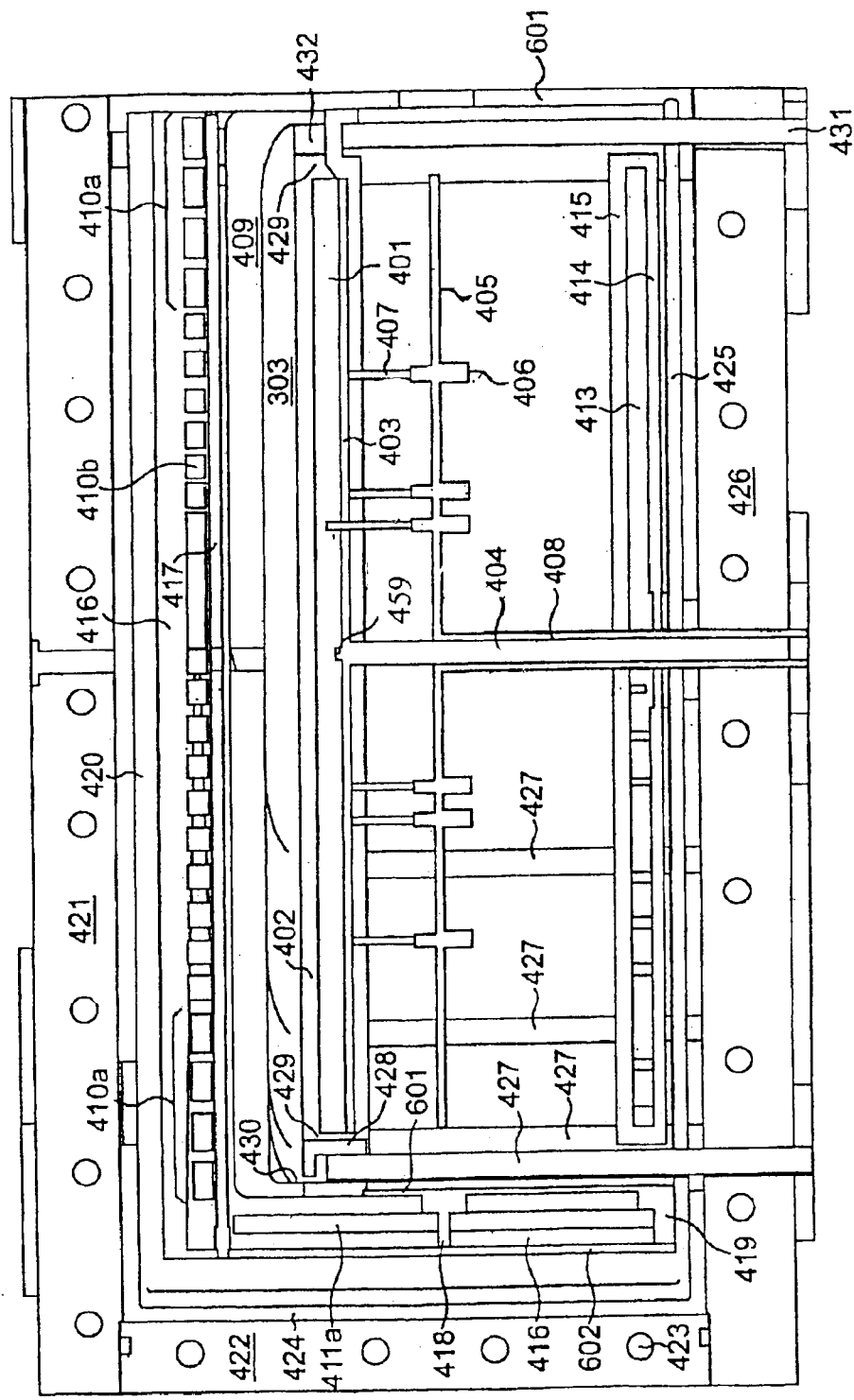
FIG. 4 illustrates an enlarged side-view of the interior of the left-hand portion of the exemplary reactor.

Referring now to FIG. 4, an enlarged view of the process cavity, depicted generally at 303 in FIG. 3, is illustrated. The process cavity 303 contains substrate holder 401, which has a slight recess 402 to help securely maintain the position of the substrate (not shown) on the substrate holder 401 during processing. The size and shape of the recess 402 may be configured, for example, so that the edge of a 300 mm (12 inch) silicon wafer rests against recess 402. Substrate holder 401 may comprise solid silicon carbide, silicon carbide coated graphite or another material that minimizes contaminant flow from the substrate holder 401 and that has compatible thermal characteristics with the semiconductor wafer. Substrate holder 401 may be referred to as a susceptor.

Substrate holder 401 is in turn supported by support plate 403 which may be composed of a material, such as quartz. Quartz offers advantages for this particular application because quartz can be fabricated into a part having a low impurity content, very low CTE, and because quartz is generally less expensive than silicon carbide. The support plate 403 may be easily bonded to center post 404. Lift pin support plate 405 may also be fabricated from quartz, and has receptacles 406 for lift pins 407. Lift pins 407 penetrate all the way up through support plate 403 to terminate inside substrate holder 401, without exiting beyond the top surface of the substrate holder 401. Lift pins 407 are said to be "nested" within substrate holder 401. Lift pin support plate 405 is attached to outer center post tube 408, which coaxially surrounds center post 404. Center post 404 also supports and registers the support plate on nub 459 in a central location (relative to the center of the substrate).

There are advantages to having the lift pins 407 nested in respective holes in the substrate holder 401, and further advantages to having a coaxial assembly of the center post 404 and the outer center post tube 408 in a centrally located position relative to lift pin support plate 405. Having the lift pins 407 rotate as the substrate rotates during processing offers advantages with regard to throughput by eliminating the need to decelerate the substrate holder and slowly rotate the substrate holder so that the lift pins perfectly align with corresponding holes on the bottom of the substrate holder before actuating pins to lift wafer off of susceptor 401.

The exemplary embodiment of FIG. 4 provides lift pin support plate 405 with receptacles 406, to which lift pins 407 are attached, and keyed to center post 404 in a rotation housing. With such a design, the pins are constantly aligned with the holes in the substrate holder, even during rotation of the substrate during processing. Thermal losses are minimized as well because the lift pins continuously aligned with, and are partially contained within, their respective holes in substrate support plate 403. Because the lift pins 407 rotate with substrate support plate 403 during processing, the lift pins 407 are positioned within the holes of the substrate support plate 403 the majority of the time. The outer center post tube 408 is keyed with the center post 404 in the rotation housing below the processing chamber (at a position roughly indicated by reference numeral 204 in FIG. 2), and the hardware associated with and responsible for lifting the wafer off the substrate support plate 403 rotate together, with the result that the lift pins 407 are always aligned with their respective holes in substrate holder 401 and support plate 403. By plugging these "thermal gaps" (the holes in the plate), heat loss from the wafer is reduced, and the thermal profile presented to the wafer from the substrate support plate 403 is more uniform. This reduces heat loss from the wafer. When it is time to unload the wafer, the wafer is first lifted off substrate holder 401 by the lift pins 407. Because the lift pins 407 are already aligned with the holes, they need only be raised enough to provide a gap for the robotic transfer arm, such as approximately ½ to 1" above the top surface of 401.

The support pin structure of FIG. 4 avoids the mechanical risks of having a lift pin support plate stationary while a substrate holder and support plate rotate. This avoids the risks of raising the lift pin support and having the lift pins misaligned. If the lift pins should break, the reactor must be opened and at least in a part disassembled to replace the pins, resulting in the loss of a significant amount of processing time. The exemplary support pin structure avoids the risk of temperature non-uniformity caused by having open (unblocked) holes in the support plate supporting the wafer, and the thermal risk of having thermal shock to the wafer if the lift pins contacting the wafer are at a different temperature from the wafer.

It should be emphasized that this concept of having rotating lift pins are not limited to epitaxial processing systems. Rather, this approach may be used in various types of semiconductor processing equipment as well, such as rapid thermal processing (RTP) and chemical vapor deposition (CVD) reactors and other systems using pins or rotating supports.

Referring to FIG. 4, the top of the process cavity is provided by hood 409. The process cavity created by susceptor 401 at the bottom, and by hood 409 at the top, serves to confine reactant gases to the process cavity for processing of the semiconductor substrate.

Working outward from the process cavity (and the susceptor raising mechanisms associated with the lift pins) is the heating system. The heating system may comprise a cage-like structure that essentially encloses the process cavity (and susceptor lift mechanism). Referring to FIG. 4, a top heater 410 may be positioned above hood 409. Since this heater is being viewed in cross-section, the heating element may pass into and out of the plane of FIG. 4, and thus the heating element appears as a number of discrete members in FIG. 4. It should be noted that top heater 410 may be configured with multiple heaters to form multiple heating zones. In the embodiment of FIG. 4, top heater 410 is configured with an inner zone and an outer zone, although other configurations are contemplated and embraced by the present invention. The outermost four rectangles at the far right and far left-hand sides of the top heater 410 comprise an outer heating zone 410a. Each of the approximately nineteen rectangles in the middle (only one of which has been labeled) comprise an inner zone 410b.

The heating system may also include side heating components. For example, the reactor may include a side heater having a top element 411a and a bottom element 411b. Alternatively, top and bottom side heating elements 411a and 411b could be combined to comprise a single heater, but having separate top and bottom elements gives the ability to more precisely control temperature uniformity of the wafer, particularly at its edges. Edge heaters provide enhanced temperature uniformity of the substrate because they compensate for energy radiated from the edges of the wafer and the susceptor to the sides of the processing chamber. In some embodiments the edge heater could comprise a single zone heater if it is determined that two edge heaters are not needed. For example, a single zone edge heater could be used if the wafer is to be processed at a vertical position approximated by reference numeral 412 in FIG. 3, which points to the port through which the substrate is loaded and unloaded from the processing chamber. In the exemplary reactor of FIG. 4, a bottom heater comprising a single zone heater is labeled 413. Of course, the bottom heater may have multiple zones as well.

Figure 5:
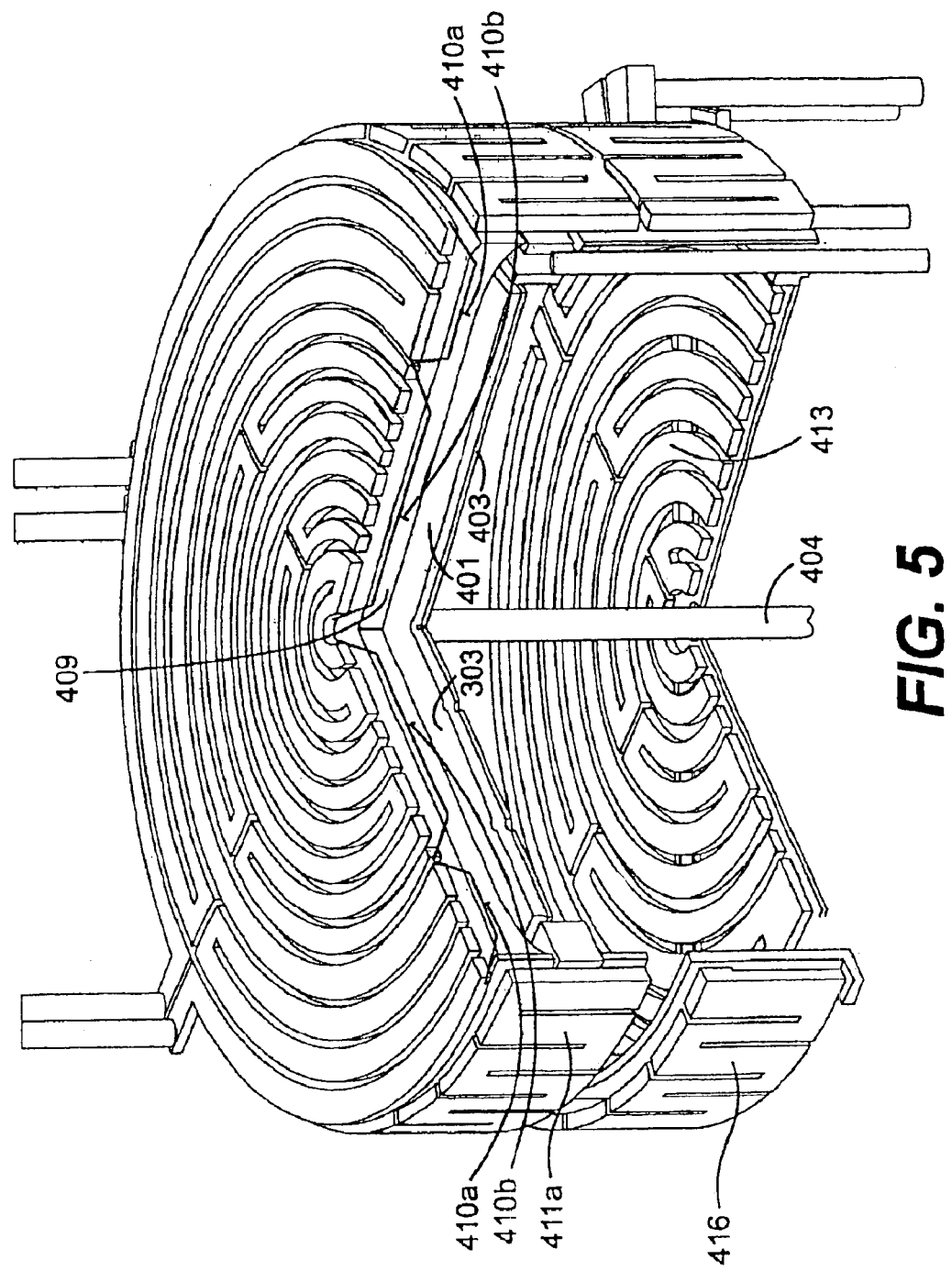
FIG. 5 illustrates an exemplary heating system which incorporates the principles of the present invention.

For further clarification, the top, bottom, and side heating elements are shown in FIG. 5 as though they had been extracted as a single unit from the processing chamber. Also shown in FIG. 5 is the substrate holder 401 and the support plate 403 underneath it, hood 409 forming the top of the process cavity, and center post 404. This FIG. 5 emphasizes the point that, in some embodiments, the heater system may comprise a cage-like structure that surrounds process cavity 303, and that by doing so, an isothermal environment is achieved giving a desired effect of no heat flow through, and excellent heating uniformity of the substrate.

It should be noted in FIG. 4 that each heating element, such as bottom heater 413, may comprise a silicon carbide coated graphite heating element enclosed in a lower shield 414 and an upper shield 415. Each of the shields may also comprise silicon carbide coated graphite, but the graphite core of the shield is not resistively heated as it is in the case of the heating element. These shields (synonymously called "enclosures") serve several purposes. They even out temperature non-uniformities from the regions adjacent to heating trace and the spaces between, generating better temperature uniformity adjacent to the heater as the heat is radiated up into the cavity. They also encapsulate the heating elements to prevent them from potentially being exposed to oxygen. A third purpose is to protect the heating elements in the event there are cracks in silicon carbide layer coating the graphite core. This prevents impurities in the graphite from reaching the process cavity.

Top heaters 410a and 410b may also be enclosed by silicon carbide coated graphite shields for similar reasons. For example, top heater 410 may be enclosed by top shield 416 and bottom shield 417. The side heaters may be enclosed by shields as well, but the shields do not necessarily have to be silicon carbide coated graphite. For example, side heaters 411 may be enclosed in quartz in one embodiment.

Figure 6:
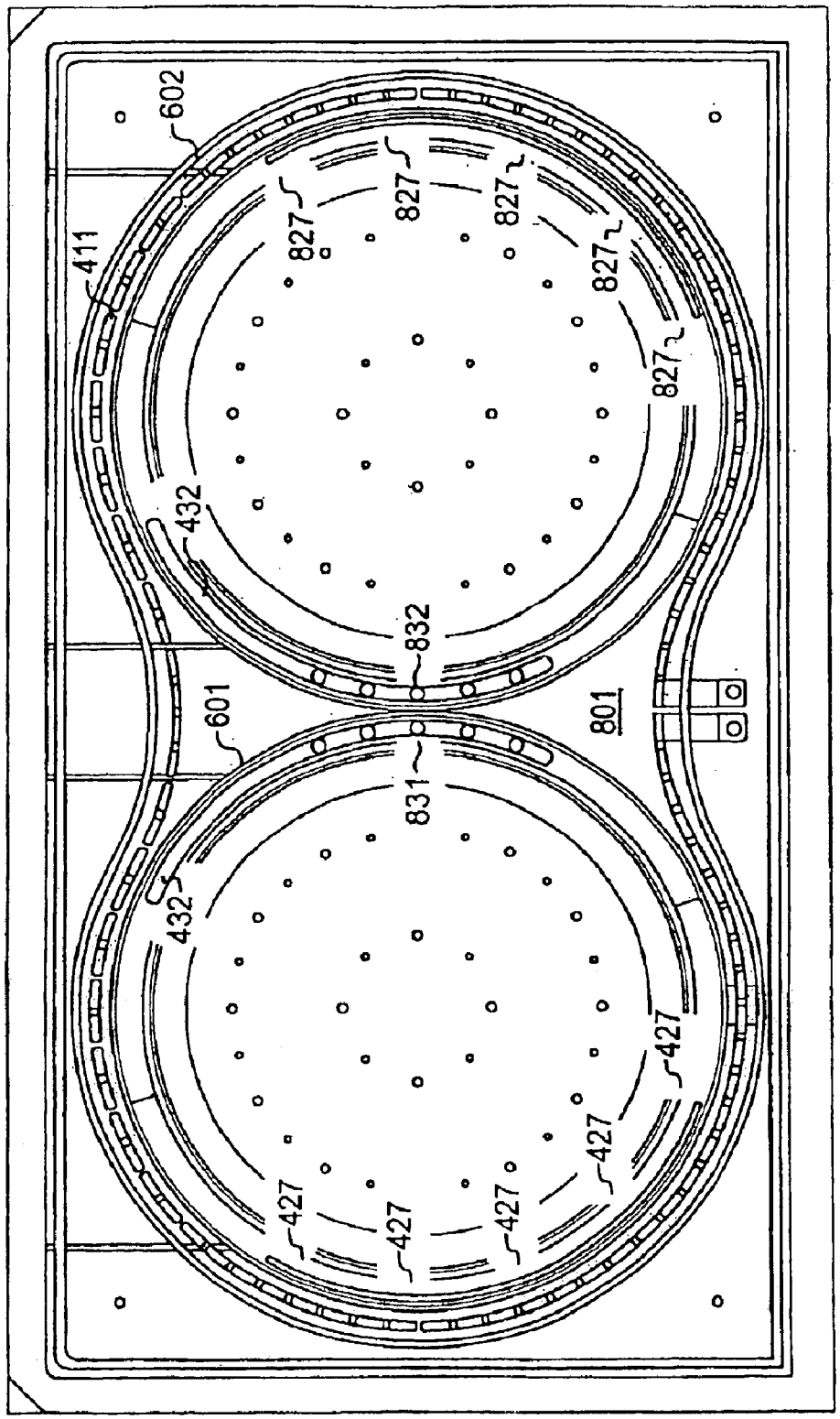
FIG. 6 illustrates a top plan view of an exemplary processing chamber, showing details of the edge heaters, side quartz liners, gas inject tubes, and gas exhaust tubes.

Referring to FIG. 6, a top view of reactor 200 showing both processing stations 301 and 302, inner quartz tube 601 and outer quartz "peanut" 602 are shown. There is an inner quartz tube 601 surrounding each of the processing stations, one on the left and one on the right. There is only one peanut shaped outer quartz shield 602 in this embodiment, such that shield 602 surrounds both processing stations. Side heaters 411 are also peanut shaped, and are positioned inside outer quartz peanut shield 602.

Referring back to FIG. 4, top side heater support piece 418 lies between the two side heaters 411a and 411b. Support piece 418 allows the upper heater to rest on the lower heater without being in electrical contact. It maintains a constant distance of separation between the two heaters and supports the upper heater. The lower heater is supported by its own support piece 419. These side heater support pieces may take on a variety of shapes, depending on the geometry of the reactor, and in case the support pieces have a substantially peanut shaped configuration, just like the side heaters themselves.

The heating element of a resistive heater may, in some embodiments, comprise a strip of electrically conductive material embedded within a matrix of a nonconductive material having a similar coefficient of thermal expansion, thus forming a monolithic structure. Further details of such a heater are described in a co-pending application titled "Apparatus and methods for resistively heating a thermal processing system," filed Nov. 16, 2000, assigned to the assignee of the present application, and incorporated herein by reference. The active heating element may be a low resistivity trace of a ceramic material embedded within a higher resistivity ceramic material having similar properties of thermal expansion. In certain embodiments, the low resistivity material may be nitrogen doped silicon carbide, which has a resistance approximately 4 orders of magnitude lower than the un-doped silicon carbide matrix.

Figure 7:
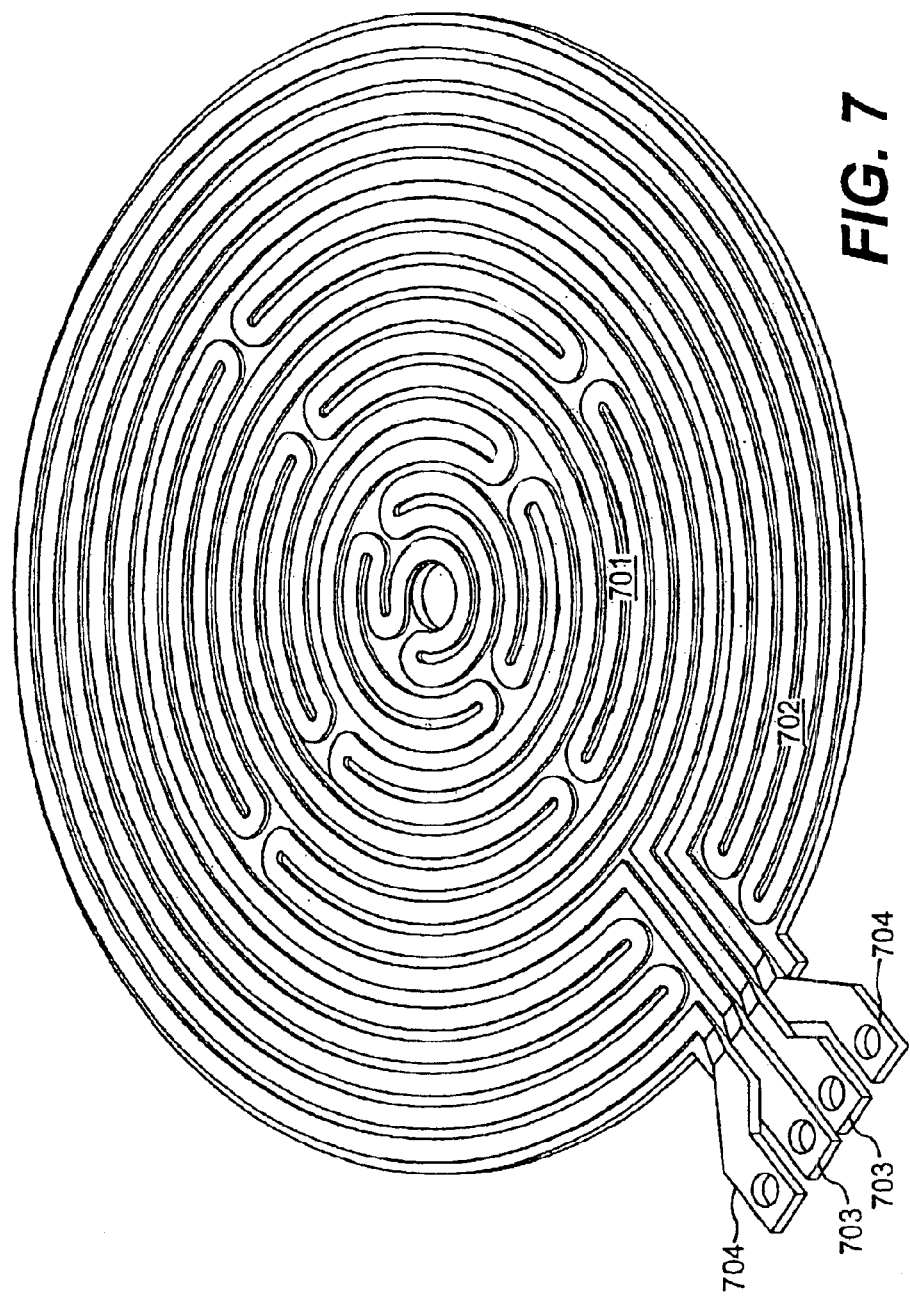
FIG. 7 illustrates an exemplary monolithic plate heater in accordance with the principles of the present invention.

An exemplary monolithic plate heater is illustrated in FIG. 7. As with the conventional silicon carbide coated graphite heaters, a monolithic plate heater can have multiple zones as shown by inner zone heater 701 and outer zone heater 702 in FIG. 7. Each zone has its own connector terminals shown as 703 and 704, respectively.

The heaters that surround the process cavity, and the structures surrounding the heater system may comprise a chamber liner until ultimately reaching the chamber walls themselves. Above shield 416 is chamber liner 420, which protects the hardware that is positioned toward the interior of the processing chamber from contaminants diffusing out of chamber wall 421, as well as protecting the chamber walls from the corrosive gasses used in the process cell. Shield 416 also provides thermal insulation for the process cavity, enhancing the temperature uniformity of the cavity, and insulating the chamber walls from high temperatures. The chamber walls may comprise aluminum, anodized aluminum, and stainless steel. Chamber liner 420 comprises opaque quartz in this embodiment, so that infrared energy is confined to the processing chamber.

The side walls 422 of the chamber may be water-cooled by flowing a cooling liquid, such as water, through the middle of the wall. The top and bottom chamber walls have water cooling holes as well (not labeled). Side walls 422 are protected by side quartz chamber liner 424. The stainless steel bottom chamber walls 426 is protected by quartz liner 425.

Figure 8:
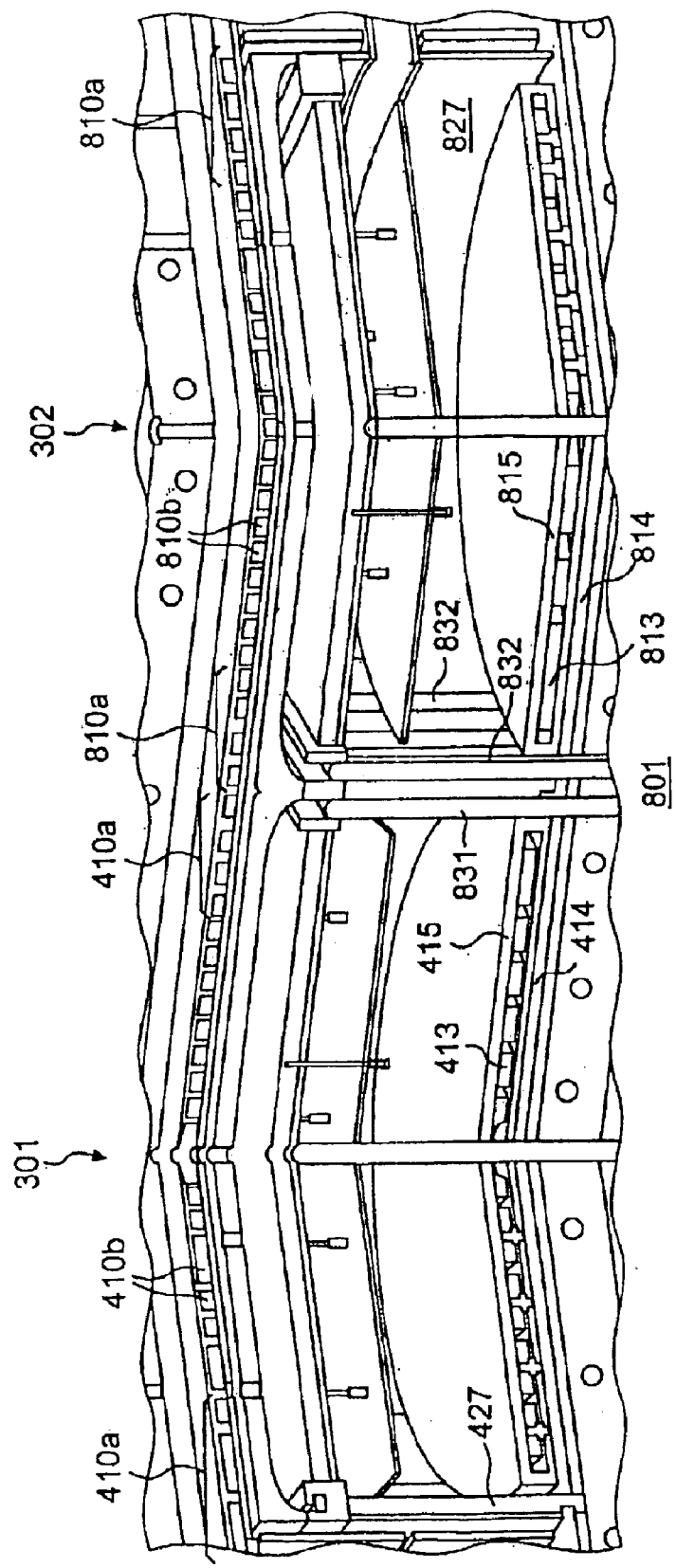
FIG. 8 illustrates a three-dimensional view of the reactor with both processing stations exposed, and shows the symmetry of the gas inject and exhaust systems.

FIG. 8 illustrates the symmetry between the two substrate processing regions of exemplary reactor 200. FIG. 8 emphasizes the concept that the principles of the present invention may be used to process two substrates simultaneously. The outer upper heater zone for the right-hand processing station 302 is labeled 810*a* in FIG. 8. Heating zone 810*a* in FIG. 8 is the right-hand analogy to left-hand heating zone 410*a* in FIG. 4. The middle heating zone 810*b* in FIG. 8 is analogous to the heating zone 410*b* in the left-hand side of reactor 200. It will be appreciated that there are no side heating elements in the middle of FIG. 8, approximately at location 801, because this heater is peanut shaped and does not extend into the region between the two processing stations (see FIG. 6 as well). Equivalently, a bottom heater 813, bottom shield 814, and top shield 815 of the right-hand processing station 302 is shown in FIG. 8.

Next, the gas inject system will be described. Embodiments of the present gas inject system are in part responsible for achieving the desired thickness uniformity, resistivity uniformity, and control over the doping transition width that is achievable according to embodiments of the present reactor.

Referring again to FIG. 4, a gas inject tube 427 is shown configured to deliver gas vertically through the bottom of the chamber 426 up into the process space 303. In one embodiment of the present invention, there are five of these gas injection tubes (with one set of tubes for each side, 301 and 302). Although FIG. 4 is a cross section of the processing chamber, three other gas inject tubes are shown in FIG. 4 in a "quasi three-dimensional" view of the reactor. The cross-section of FIG. 4 passes through the gas injection tube on the far left, and may be used to illustrate how the gas injection tubes "plenumize" the gas. The term "plenumize" refers to the spreading of a gas flow in a desired manner by flowing the gas through a plenum. A plenum is a device (which may be a manifold) that acts to restrict the flow of the gas such that the gas flow is higher on the upstream side of the plenum, and in doing so the gas stream is shaped into a desired flow pattern.

The process gases flow up through tube 427, and pass through gas inject support ring 428. Gas inject support ring 428 rests on quartz inner support tube 601. Inner support tube 601 provides mechanical support for gas inject support ring 428, but it also "nests" (or houses) the circular shape of the quartz tube so that it is registered to a particular position. Gas inject support ring 428, in turn, supports the gas inject plenum 429, into which the gases feed from gas injection tube 427. The gases then flow through plenum slot 430 before being redirected from a vertical to a horizontal flow across the substrate. Plenum slot 430 also serves to maintain zonal control of both concentration and flow through each of the five inlet tubes. The gases are "plenumized" by plenum 429, and are spread out into a linear fan across the substrate. This concept may be seen better in FIGS. 9 and 10.

Figure 9:
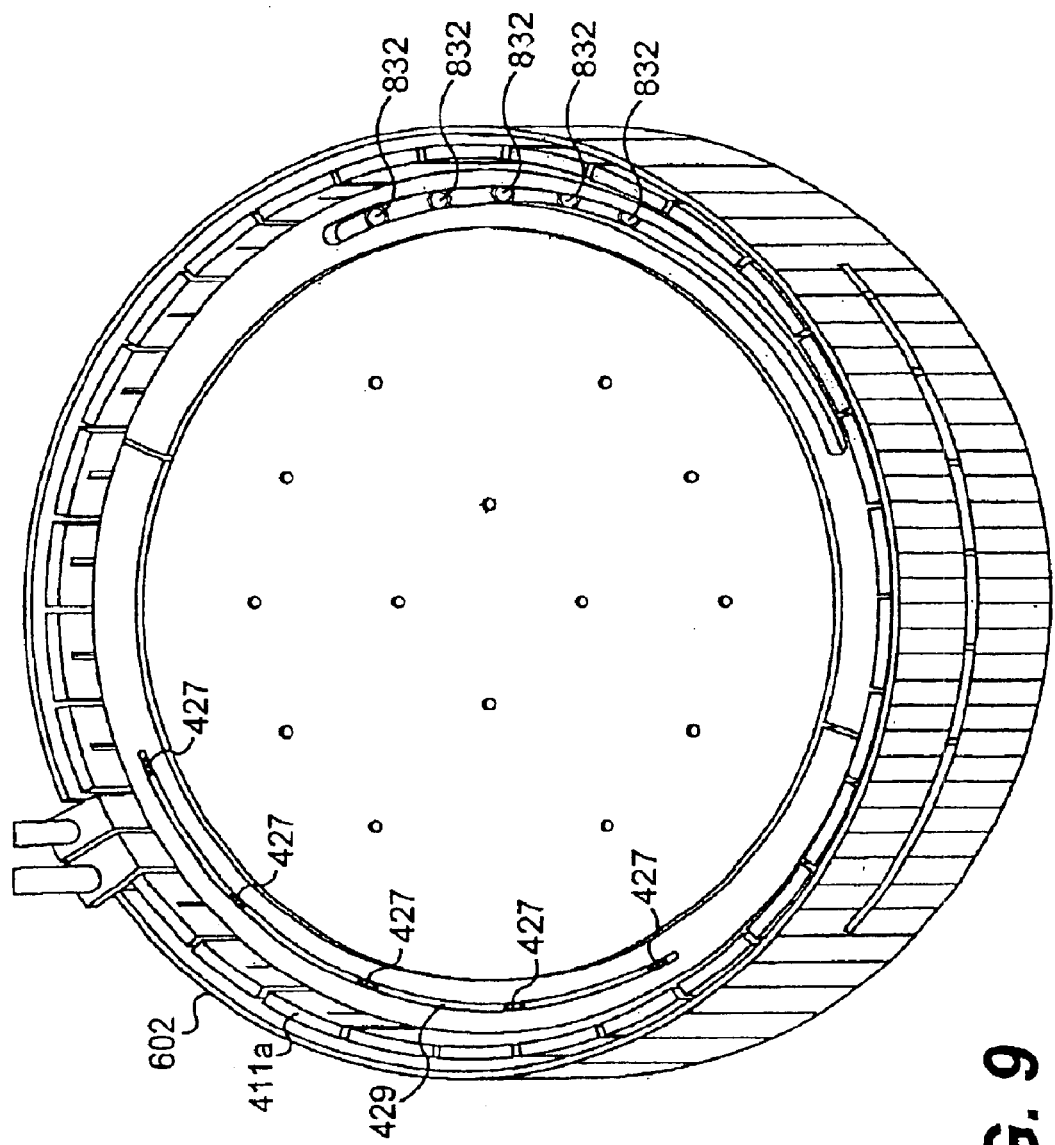
FIG. 9 illustrates a top, plan view of the gas inject tubes and gas exhaust tubes.
Figure 10A:
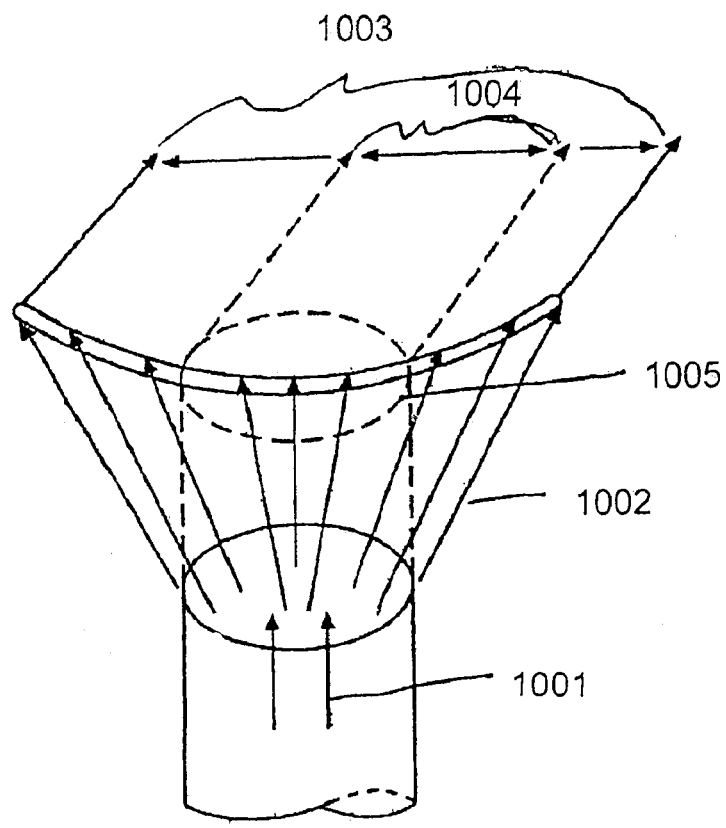
FIG. 10A illustrates how the gas from a gas inject tube may be spread out to achieve a more uniform distribution.
Figure 10B:
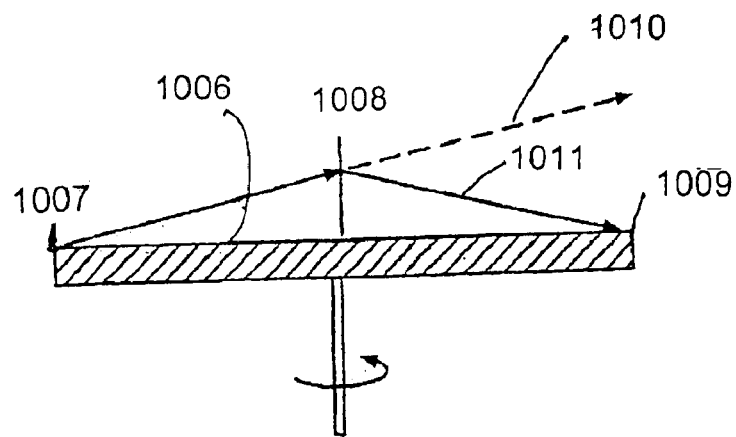
FIG. 10B illustrates a schematic illustration how the dopant concentration may be depleted from the feedgas stream.

Referring to FIG. 9, plenum 429 is arc-shaped in a plain view, and the tops of the five inject tubes 427 are just visible through their respective slits 430 in the plenum. Again, the concept underlying plenum 429 and slits 430 is to have a flow that is more spread out that would be achieved otherwise with five individual tubes. This is depicted schematically in FIG. 10A, where a gas stream 1001 spreads out into a fan shaped flow 1002 before passing through slit 430. This results in a wider coverage over the substrate, having an exemplary width 1003, rather than the smaller width 1004 that would have occurred if gas stream 1001 had been confined to a flow having the same diameter as tube 427 at location 1005. The fan forces the flow to go from a circular shape into a slotted, linear flow. In another embodiment, the fanning-out nozzle may be part of the quartz gas inject tube.

There are five gas inject tubes 427 in this embodiment, but the number could range from about 1 to 9. Five inject tubes may be used, particularly with 300 mm substrates, because of the manner in which the gases spread out over the substrate, and because of the ability to control dopant, silicon, and mainstream gas concentrations over different regions of the substrate, and hence effect resistivity, thickness, and overall uniformity respectively.

Figure 11:
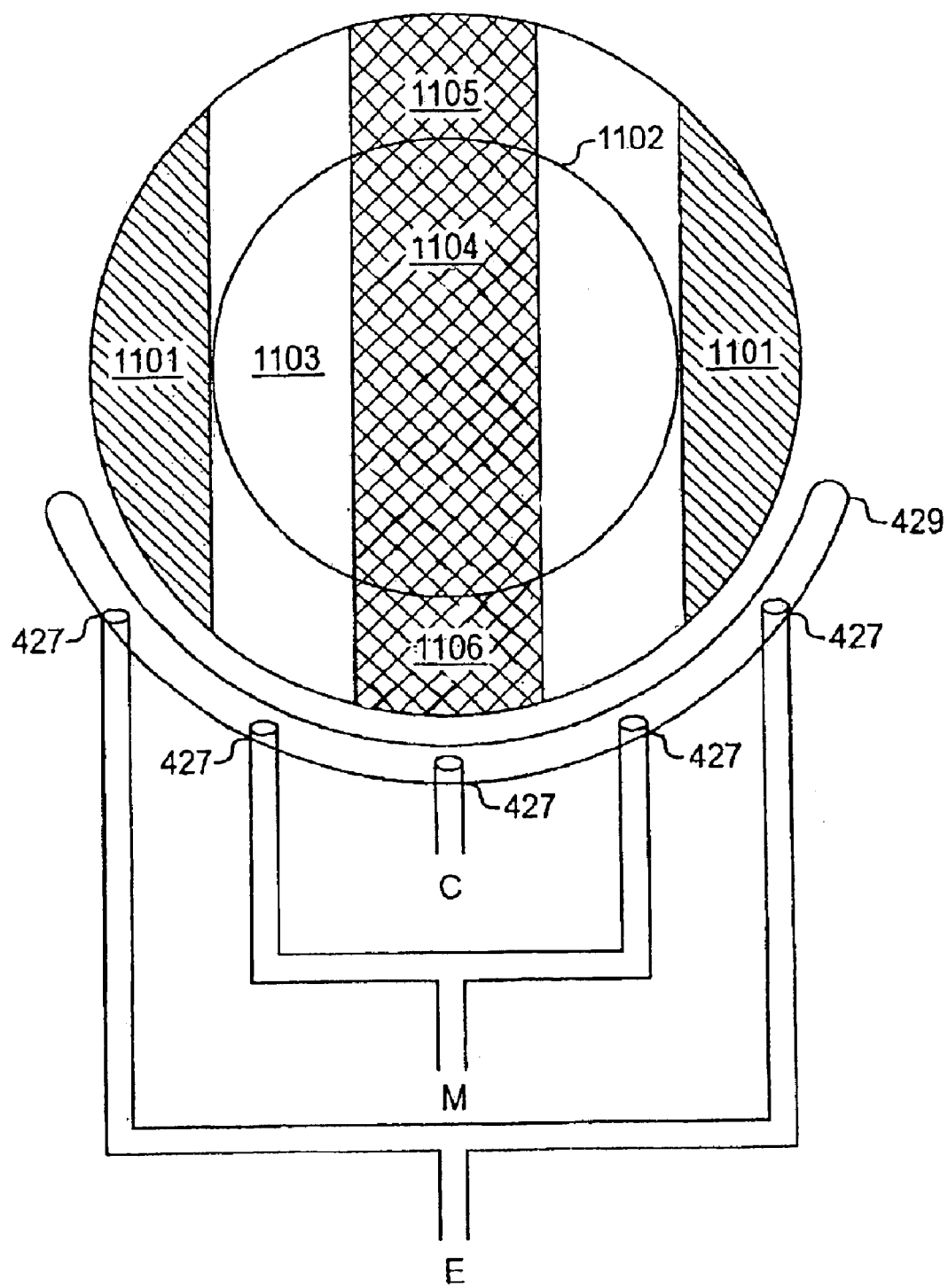
FIG. 11 illustrates how the gas inject system may be configured to achieve a desired thickness and uniformity resistivity.

Referring to FIG. 11, the design of the gas inject system will now be described to explain several advantageous features of this embodiment. The two outer gas inject tubes are fed from the same source, and are labeled "E" for "edge." Working inward from the edges toward the center, the next two gas tubes are labeled "M" for "middle." Finally, the center tube is labeled "C" for "center." In this embodiment, the gases are plumbed such that there is independent control of the silicon concentration, dopant concentration, and carrier gas flow (the carrier gas may be hydrogen, and may be called "hydrogen mainstream") for each of the three zones edge, middle, and center.

The edge feed plenumizes (or splits) into the two edge jets, and that portion of the source flows over the edges of the wafer indicated (if a "snapshot" in time could be observed) in general by the cross-hatched regions 1101 in FIG. 11. Since the substrate is rotating, however, the region of the wafer covered by the two edge inject tubes fills the annulus outside the circle indicated by 1102 in FIG. 11. The regions supplied by the two middle inject tubes, at an instantaneous snapshot in time, is shown by the unhatched region 1103 of the substrate. Gases from the middle zone fan out to cover a zone that is neither edge nor center in character. The center jet covers the double cross hatched region 1104, again ignoring the fact that the substrate is rotating. Of course, there will be a blending of the regions, even though the flows have been represented as being discrete and non-overlapping in FIG. 11.

The ability to control the concentration of the dopant in the gas flows being delivered to each of the three zones has consequences with regard to epitaxial film properties, such as, for example, resistivity uniformity. As stated earlier, the dopant concentration may be heavier than desired at the edges of the substrate due to the autodoping effect caused by dopant de-gassing from the backside of heavily doped wafers. If this is the case, the doping concentration in the gas flow being delivered to the edge zone 1101 may be reduced to compensate for the fact that the doping is high on the edge from the backside autodoping.

Another edge effect stems from the fact that the dopant concentration can be depleted from a supply gas as the gas supply flows across the substrate. This is illustrated schematically in FIG. 10B, which is a pictorial representation of the electrical resistivity of an epitaxial film as a function of distance from the edge of substrate 1006. The dopant is consumed from the gas stream as the gas flows across the substrate. Since the electrical resistivity is inversely proportional to dopant concentration (the higher the dopant concentration, the higher the electrical conductivity, which is the same as saying the lower the resistivity), the electrical resistivity increase from a first edge 1007, to the center 1008, to the opposite edge 1009. The resistivity starts off low at edge 1007 because the gases flowing across the edge region are dopant rich. The resistivity increases going from 1007 to 1008 because the dopant from the feedgas stream is being depleted. If the substrate were not rotating, the resistivity profile would have a continuously rising slope has shown by dotted line 1010 in the Figure. Since the substrate is rotating, however, the resistivity bends back down along line 1011 because the region marked 1009 eventually rotates around to the postion at which edge 1007 resides, and now it sees the feedgas stream with the highest dopant concentration.

Now consider the ability to inject more dopant through the center injection tube C. Injecting a feedgas through gas inject tube C that is slightly higher in dopant concentration than the feedgas being injected through feed gas tubes E can compensate for the depletion of dopant from the feedgas as it flows over the substrate. Although the edge of the substrate does pass through the regions labeled 1105 and 1106, for regions that are governed by flow from the center, nevertheless, the edge spends less time in these regions than it does at 1101.

Such a gas inject scheme gives the ability to compensate for natural phenomena such as edge depletion and autodoping. Note that the system allows control of the concentration of all three components of the feedgas in each of the three zones, the three components being the concentration of the silicon source gas, the concentration of the dopant source gas, and the type and flow of carrier gas. The ability to manipulate each of these components, independently, and in each of the three zones separately, offers flexibility in the ability to control resistivity uniformity. For example, if it is desired to increase the resistivity in a certain region, the concentration of dopant may be decreased. Alternatively, if it is desired to increase the thickness in a certain region, the concentration of silicon may be increased. In another case, the ratio of silicon to dopant could be maintained, and the flow of the carrier gas alone may be increased or decreased to deliver the same ratio of silicon to dopant but allow changing the uniformity of that mixture.

The process gases are exhausted after flowing across the surface of the wafer. Once the feedgas has entered through gas inject tubes 427 into plenum gas ring 429, out of plenum slits 430, and into process space 303, it crosses over the substrate and exits through the same gas inject ring 429. It does so by exiting into an exhaust trough 432 (which is not really a plenum, since there is no back pressure generated), shown on the right-hand side of FIG. 4. Exhaust tube 431 may be one of a number of exhaust tubes, and there are five exhaust tubes in this exemplary embodiment, but the number may be more or less than five. In alternative embodiments, the number of exhaust tubes may range from about 1 to 9, where each tube may have a diameter of approximately between $\frac{1}{4}$ inch to $\frac{1}{2}$ inch. In the way that FIG. 4 has been drawn, gases enter from the left and exit to the right. Referring to FIGS. 6 and 8, however, one may gain an appreciation that, in this exemplary two-substrate at a time processing reactor, gases enter from the extreme left and right-hand sides of the figures, and exhaust into the center. In FIG. 8, gases from inject tubes 427 within the left-hand processing station 301 exit the process cavity through exhaust tubes 831. In a symmetrical manner, gases from inject tubes 827 within the right-hand processing station 302 exit the right-hand process cavity through exhaust tubes 832 (of which two of the three have been labeled).

The ability to control the flow of gases, and hence influence thickness and resistivity uniformity, exists at the exhaust level as well as at the inject level. The exhaust pumping pressure may be controlled at each of the five exhaust tubes (per process station) individually, such that exhaust gas may enter any of the five tubes, depending on which has the strongest vacuum (negative pressure relative to the process cavity) applied to it.

A general overview of the gas supply and exhaust systems has now been discussed. Included in this discussion was the manner in which these systems may be configured to exert control over film properties such as film thickness and resistivity uniformity. Having reviewed the hardware that delivers and removes a process gas to and from a process cavity, a more detailed discussion of gas chemistry pertinent to epitaxial depositions follows.

Gases are injected through tubes 427, are directed by plenum slots 430 into process cavity 303, then travel across the substrate, and are exhausted through ports 431. As they are ejected from the slot 430, they "bounce" off the lower, inner surface of hood 409, and change direction from vertical to horizontal to flow across the process cavity toward the exhaust tubes. This re-direction of the flow is performed for a several reasons, one of which is to preheat the feedgas in preparation for its decomposition and subsequent reaction. A particular advantage of this strategy is apparent when silane is used as a silicon source gas, but at the present time, epitaxial silicon depositions are commonly performed with chlorinated silanes, wherein trichlorosilane is perhaps the industry standard.

Deposition of epitaxial silicon from trichlorosilane is postulated to involve a series of reversible reactions:

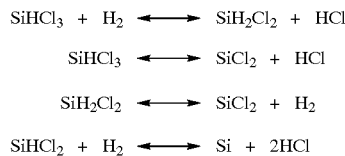

Since these reactions are reversible, deposition (the forward reaction) competes with etching (the reverse reaction). In contrast, deposition from silane is not reversible:

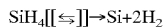

and there are no HCl by-products. Advantages of depositing from silane are that epitaxial films can be obtained at lower temperatures than the chlorosilanes, silane is readily available and more environmentally "friendly," and the lack of chlorine means less chemical attack of delivery lines and systems, and hence less potential for metallic contamination of the film.

The chlorine content of the silicon source gas affects the growth rate of film according to the following pattern: for a given temperature, the higher the chlorine content, the slower the growth rate. The chlorine content also affects the transition temperature at which polycrystalline and single crystal silicon is grown. With silane as the source, epitaxial silicon films may be grown at temperatures as low as 900° C. At the other end of the extreme, reaction temperatures for the deposition of single crystal silicon from $SiCl_4$ must be kept above 1100° C.

A disadvantage of depositing from silane is that gas phase (homogeneous) nucleation is commonly observed, and such an event is undesirable since silicon aggregates may lead to particle contamination. Because of the potential advantages outweigh any disadvantages, what is needed is a reactor specifically designed to mitigate these problems such that it can be configured to deposit an epitaxial silicon film from silane. A discussion of the capability of the present reactor to epitaxially deposit silicon from silane will be reserved for later.

Continuing with the chlorinated silane that represent at present the industry standard, trichlorosilane undergoes a thermal decomposition initiated at a range of temperatures from about 400 to 700 degrees C. The need to provide an activation energy to the reaction, which in one embodiment may be supplemented by pre-heating the reactant gases before they reach the substrate, is highlighted by the fact that in conventional systems failure to pre-heat the reactant can cause additional maintenance difficulties, and poor reaction yields.

Lamp-heated, conventional bell jar reactors are often horizontal flow systems. Referring again to the reactor depicted in FIG. 1, one notes that the reactant gases first pass over section 115 of the susceptor 103 before encountering any part of the substrate. This serves to pre-heat the gases. The pre-heating step begins the dissociation of the silicon containing component of the feedgas; otherwise, the gas stream will have progressed well over the substrate before any dissociation has begun. In this latter case, with no pre-heating of the gases, and where dissociation of the silicon containing gas has begun at too late a stage, the growth tends to be thicker on the downstream portions of the substrate, and poor thickness uniformity may result.

Figure 1:
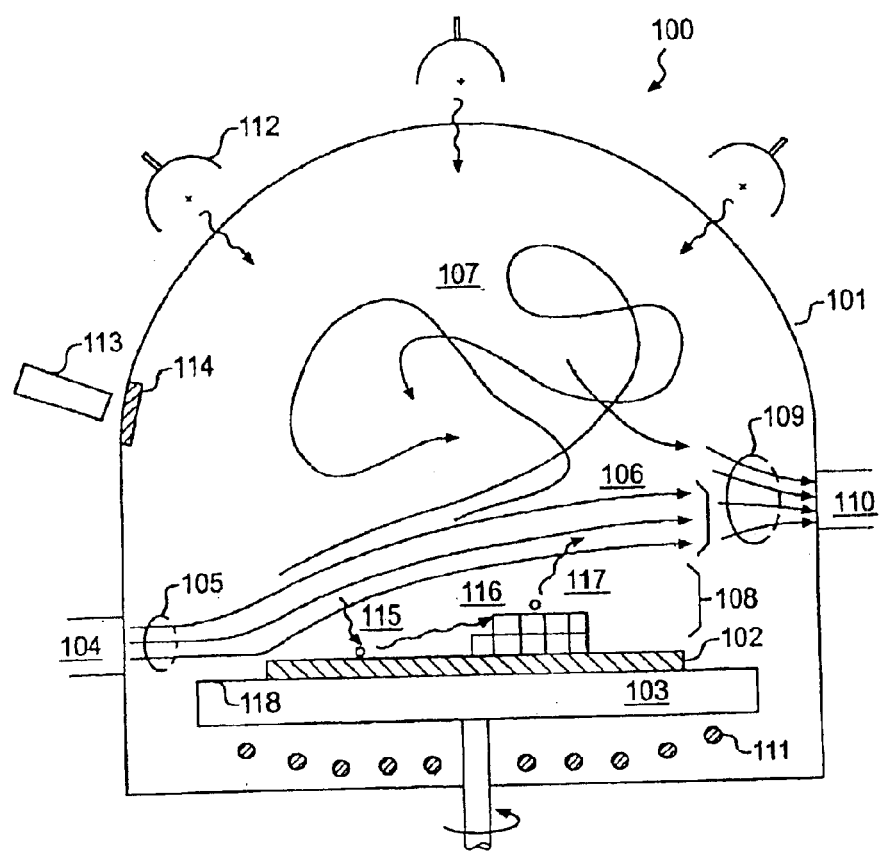
FIG. 1 illustrates an exemplary reactor for depositing epitaxial layers in accordance with an existing approach.

Embodiments of the present invention may provide higher growth rates than those of the reactor shown in FIG. 1. One reason that allows this to be accomplished is the "high energy content" of the process cavity. The substrate is sandwiched between two plates (hood 409 and susceptor 401) which in some embodiments are maintained at a temperature of about 1150 degrees C., so that the gases heat up quickly, gain the thermal excitation state necessary for decomposition, and subsequent reaction. The reactant gases may be pre-heated in a conventional lamp system sufficient to begin the dissociation process, but as the gases flow over a hot substrate 102 with a cold quartz bell jar 101 overlying the process space, the gasses heat up, expand, and then naturally convect upwards off of the wafer towards cooler region near the cool upper quartz window This convection may adversely effect growth rate.

A second problem experienced with conventional reactors is that unreacted gases and reaction by-products are conducted into the exhaust lines, where they re-condense into a trichlorosilane-based liquid waste substance. In fact, a dangerous situation may arise because the resulting coatings may be pyrophoric. The efficiency of the reaction in a reactor similar to that of FIG. 1 has been estimated to be about 5 to 10 percent, even with pre-heating, which means that a large majority of the reactant gases are being wasted as they condense on the walls of the exhaust lines.

According to embodiments of the present invention, reactant gases may be pre-heated by virtue of the fact that gas inject tubes 427 enter the processing chamber through bottom wall 426. After passing through bottom wall 426, they go through bottom heater 413, and thus are positioned within the "heater cage" almost immediately upon entering the processing chamber. After passing through bottom heater 413 they travel toward the top of the processing chamber in a space adjacent to side heaters 411b and 41a, which gives the feedgas traveling to the process cavity the opportunity to be pre-heated.

Despite the desirability of pre-heating the feedgas, it is important that it is not overheated. In the case of silane, if the reactant gases in the feedgas stream become too hot, a gas phase nucleation may occur, creating small clusters of solid silicon atoms in the gas phase. This is undesirable because a small cluster of silicon atoms is unlikely to reach the surface of the growing epitaxial film in an appropriate orientation to continue single crystal growth. This may be the case even if the cluster contains only a few atoms. In addition to the cluster's inability to properly orient to the surface for single crystal growth, which at best produces a polycrystalline film, it may simply fall to the surface as particulate contamination.

Embodiments of the present invention pre-heat the gas without overheating it by, among other things, controlling the speed at which the feedgas is flowed through gas inject tubes 427, and the volume of the carrier gas component. The greater the volume of the carrier gas (such as hydrogen) in the feedgas stream, the cooler the gas will be as it exits the tube through slot 430 to enter process cavity 303. The feedgas stream picks up less heat the faster it is flowed through gas inject tube.

Another technique for controlling the temperature of the reactant gases prior to their entry into the process cavity, in a less dynamic fashion, is by selection of the materials from which gas inject tubes 427 are fabricated. In other words, coarse control of the temperature of the feedgas may be realized by choosing an appropriate material for the tube 427. (NOTE: for even less gas heating than clear quartz, a co-axial tube could be used with H2 in the outer annulus and the process gas in the inner tube) A first choice is clear quartz, which provides a relatively low level of heating due to the transmission of the majority of incoming radiation (emissivity ~0.15). A second choice is opaque quartz, which partially absorbs radiation and, as a result, provides a higher level of heating. A third choice is silicon carbide, which provides an even higher level of heating due to it's absorbing a major portion of the radiation. The middle selection, opaque quartz (emissivity ~0.30)., heats the gas more than clear quartz, but less than silicon carbide (emissivity ~0.75). Computer modeling work done in support of the development of the numerous embodiments of this invention have shown that the temperature of the gas exiting slot 430 can be varied somewhere between 300 and 900 degrees C. simply by changing the materials of the gas inject tube. Only the materials were varied in one model. The model looked at a fixed flow, where only the materials of the tube were varied.

Figure 12A:
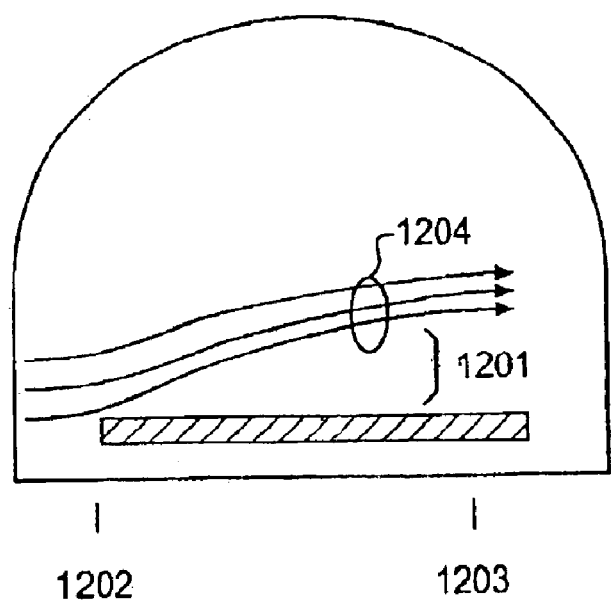
FIG. 12A illustrates, schematically, a thick gas flow boundary layer in a conventional epitaxial reactor.

The yield of the reaction may be influenced not only by the temperature of the reactant gases, but by the shape of the boundary layer as well. A showerhead design, having gases directed perpendicularly toward the substrate, provides a more efficient use of the feedgas, in part because of the lack of any substantial boundary layer. The boundary layer of a conventional bell jar and direct flow reactor may be depicted as boundary layer 1201 in FIG. 12A. The boundary layer continues to pull away from the substrate after it has been formed at location 1202, and as the gases flow toward position 1203. A competition is induced within the boundary layer between the silicon containing gas molecules diffusing toward the surface of the substrate, and the HCl reaction products diffusing from the surface of the substrate back into gas stream 1204. The bell jar reactors of FIG. 12A has a boundary layer 1201 that increases in thickness in going from position 1202 to 1203, and consequently it becomes more and more difficult for the exchange to take place.

Figure 12B:
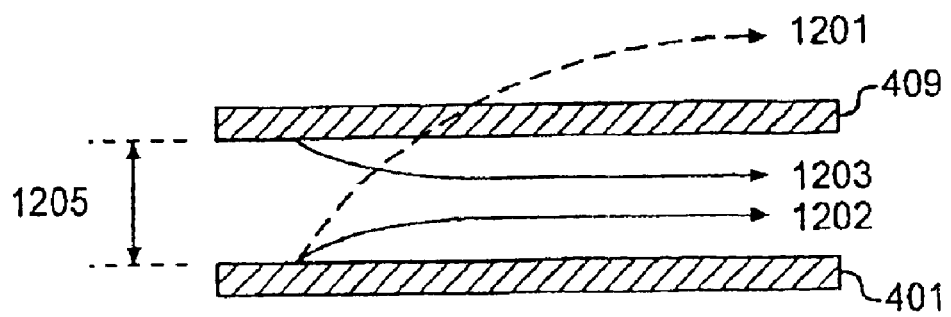
FIG. 12B illustrates, schematically, a thin gas flow boundary layer according to embodiments of the present invention, where gases are confined to a narrow space between two parallel plates.

Embodiments of the present invention provide a flow between two closely spaced parallel plates, the bottom plate 401 being the susceptor, and the top plate 409 being the hood, as illustrated in FIG. 12B. A second boundary layer 1203 is formed adjacent to the top plate (hood 409). By restricting the height of the process cavity in this manner, the thickness of boundary layer 1201 is thinner, and the boundary layers in FIG. 12B, as shown as 1202 and 1203, will converge together somewhat asymptotically. FIG. 12B illustrates the conventional reactor boundary layer 1201 in relation to "new" boundary layer 1202. The top plate (hood 409) has the effect of compressing boundary layer 1201 to its new shape 1202. The advantage of having a thinner boundary layer 1202 is that the transport distance to get reactants to the substrate is smaller, and similarly, the distance reaction by-products must travel to join the gas stream is smaller as well.

Embodiments of the present invention provide the ability to vary the distance separating the two plates (susceptor 401 and hood 409). Typical separation distances range from about 0.25 to about 3 inches. The distance separating the susceptor and the hood will affect many properties, including, growth rate, thickness and resistivity uniformity, autodoping, and other doping characteristics, because for a given gas volume, the flow will be faster for a smaller process space. In embodiments of the present invention, the ability to vary separation distance 1205 (the process cavity height) can be used to provide additional control over processing properties. It is estimated that embodiments of the present reactor provide a reaction efficiency that is at least two times more efficient than a reactor of the type shown in FIG. 1.

The primary method of injecting gases into the process cavity has now been discussed, as well as the reasons for pre-heating the gases, and the techniques by which this method may be accomplished. In alternative embodiments, there are other methods for injecting gases into the system. These techniques include gas delivery through accessory hardware, such as the temperature measuring devices, as well as via a showerhead positioned inside the process cavity. Any or all of the feedgas components may be delivered according to these techniques. For example, a dopant supply gas may be injected through a temperature measuring device, such as an optical pyrometer, to adjust the resistivity uniformity of the growing epitaxial film. Alternatively, a carrier gas such as hydrogen may be injected through a showerhead to control the temperature of the feedgas, and to dilute the concentration of the source-gas components. One exemplary showerhead design, for example, could include a plenumized mainstream for gas temperature control over the wafer, plenumized silicon with H2, plenumized dopant with H2, and plenumized silicon and dopant with H2. The showerhead could also provide localized silicon, dopant, silicon and dopant injection where the showerhead would be used to "fan out" the direct inject point to a larger diametrical area over the wafer whose area would be dependent on the showerhead hole sizes and overall flow from the direct inject source above the showerhead.

A common device for measuring the temperature of a surface inside a processing chamber is an optical pyrometer, known in the vernacular as a "light pipe." The normal function of an optical pyrometer is to look at the substrate through a vacuum feedthrough, and to collect information about the substrate regarding its temperature. According to embodiments of the present invention, however, a purged optical pyrometer may also be used to inject supplementary dopant supply gases, as needed, to under-supplied regions of the substrate. The injection is accomplished by introducing a purge gas through the optical pyrometer.

Figure 13:
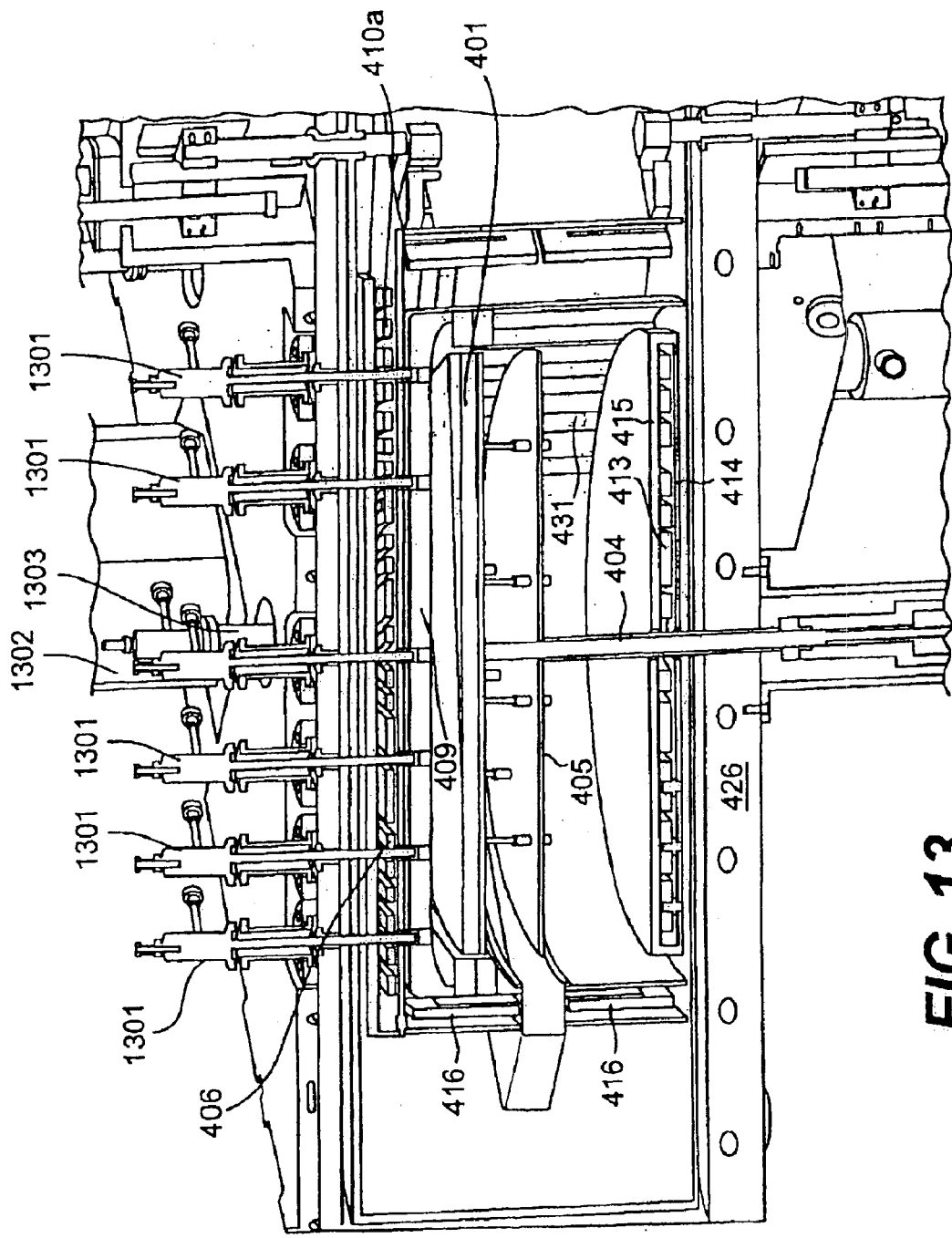
FIG. 13 illustrates an exemplary distribution of temperature measuring devices that take readings from the top of the substrate and, in some embodiments, also inject gases to adjust thickness and resistivity uniformity.
Figure 14A:
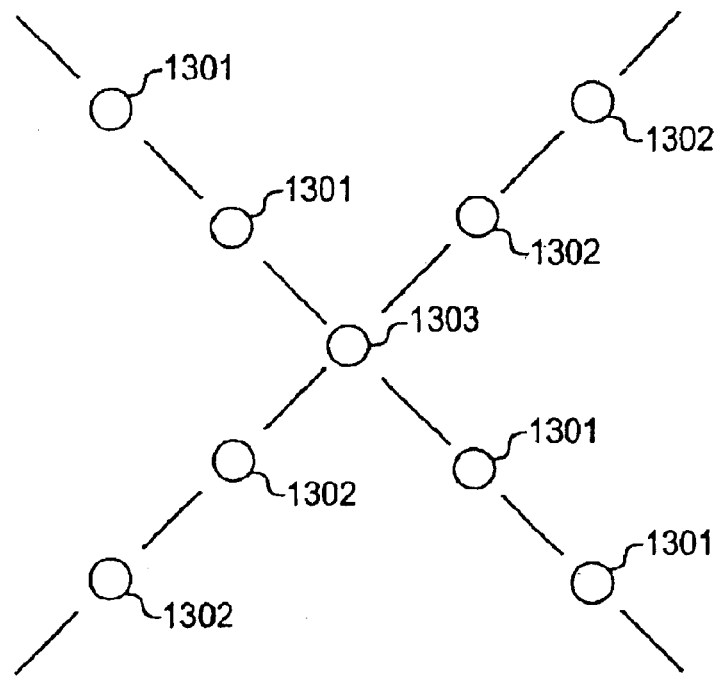
FIG. 14A illustrates a top, plan view of two, intersecting arrays of temperature measuring devices.

FIG. 13 shows a side view of the processing chamber, with parts of the reactor in three-dimensions, to illustrate alternatives for injecting gases into the process cavity. This method may be used to supply dopant to specific locations on the substrate for the purpose of mitigating a depletion effect, or dealing with an uneven growth condition. FIG. 13 shows multiple temperature measuring feedthrough systems 1301. The systems comprise a quartz light pipe that transports light energy from the area to be measured to an optical pyrometer, and the optical pyrometer is the device that produces an actual temperature reading. The light pipes labeled 1301 in FIG. 13 are aligned along one radial direction, and there may be several additional radial directions along which light pipes are aligned, such as a second direction labeled 1302, with 1303, being at the center, participating in each of the two directions mentioned so far. This is illustrated schematically in FIG. 14A.

Figure 14B:
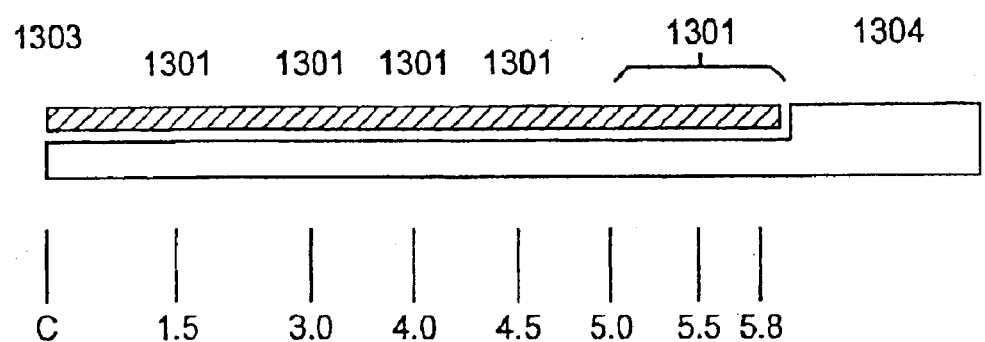
FIG. 14B illustrates a side view of how temperature measurement devices along an array may be distributed, as a function of distance, from the center to the edge of a substrate.

The light pipes need not be evenly distributed along any one radius, as illustrated in FIG. 14B. In FIG. 14B, one exemplary optical pyrometer is positioned at about 1.5 inches from the center of the substrate, which is where light pipe 1303 is positioned. From that location, working outward toward the edge, the first few optical pyrometers are placed at 1 inch increments from the center, such that a second optical pyrometer is positioned at about three inches from the center, and a third optical pyrometer at 4.0 inches from the center. Continuing toward the edge, the separation between pyrometers switches to one half inch increments, and the fourth, fifth, and sixth pyrometers are positioned at 4.5, 5.0, and 5.5 inches from the center of the wafer. From here, and the increments become even smaller, such that the next to last pyrometer is at 5.8 inches from the center.

The pyrometers are not spaced as closely together in the center region of the substrate because the edge heaters do not have as much of an effect in the center region as they do at the edge. The pyrometer that is at the farthest distance from the center of the wafer, which may be at 5.8 inches, or further, is actually in a position overlying the susceptor as well. The last optical pyrometer that looks at the edge of the susceptor is labeled 601.

The temperature monitoring done with the purged lightpipe arrays previously described as having the capability to provide an auxiliary gas inject system may be done passively; that is to say, without participating in a closed loop system. In a closed loop system, information from a temperature measuring device is relayed to a control system, which in turn adjusts the power delivered to a heater system. Passive monitoring takes a measurement, but does not use the information in a feedback loop to the heaters. Alternatively, the gas inject system may participate in an active system.

Figure 15:
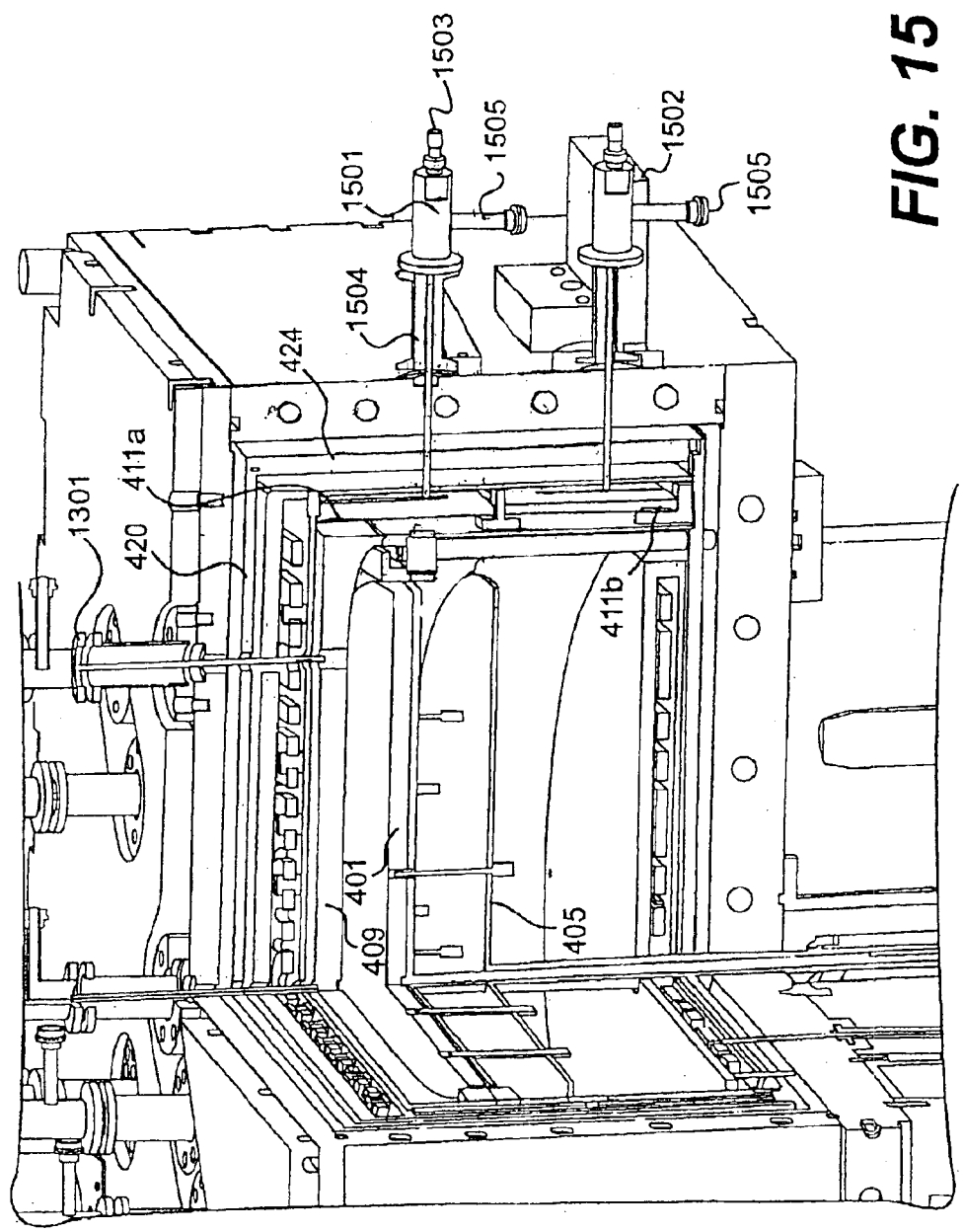
FIG. 15 illustrates a cross-sectional view of an exemplary reactor in which a temperature measuring device may be used to inject a purge gas to a processing chamber.

In either case, the temperature measuring devices may be used to inject gases as illustrated in FIG. 15. Referring to FIG. 15, lightpipe housing 1501 is used to receive information from the upper edge heater 41a. Likewise, lightpipe housing 1502 looks at the lower edge heater 411b.

Purge gases may be injected through a lightpipe housing vice in the following manner. A sheath 1504 is co-axially mounted around the actual lightpipe transmission tube and translates into the lightpipe housing. This sheath/light pipe assembly enters into regions inside the process chamber, via a conduit that runs through the chamber wall, quartz insulation, and outer shield of the heater. The light energy from the heater is transmitted by total internal reflection in the fiber out into the lightpipe housing where it translates into a flexible glass fiber bundle at nipple 1503 and continues it's path via total internal reflection to the actual pyrometer, which converts the light energy information into a calibrated temperature.

Figure 16:
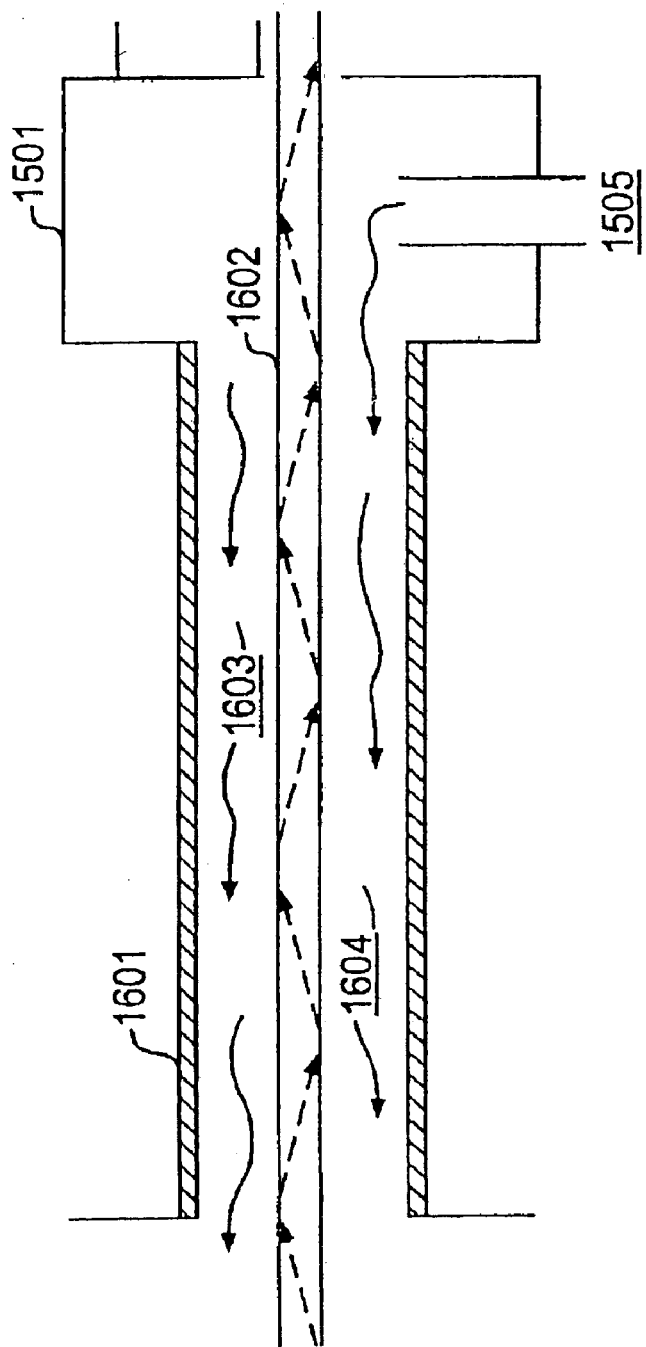
FIG. 16 illustrates an exemplary configuration of an optical fiber and sheath in which a purge gas may flow inside the sheath but outside the optical fiber.

A purge gas may be injected through fitting 1505. The purge gas travels from fitting 1505 to the processing chamber by flowing inside the sheath, and around the outside of the optical fiber. A simplified drawing that illustrates that more clearly is shown in FIG. 16. An optical fiber 1602 is positioned coaxially within sheath 1601, and purge gases 1604 flow inside the sheath. Light undergoing total internal reflection 1603 is shown traveling within the optical fiber.

A typical purge gas may be an inert gas, a noble gas, or a carrier gas such as hydrogen. The type of gas is not important, as long as there is a flux of any gas to prevent an undesired deposition on the tip of the fiber. The volume of the gas required to keep the system clean is minimal, and may range from about 100–500 cubic centimeters per minute, with 100–200 cubic centimeters per minute being typical. The purge gas may be exhausted from the chamber using exhaust tubes 431. In some embodiments, such as the exemplary embodiment of FIG. 13, each of the optical pyrometers 1301 and 1302 exhaust their gases over the substrate.

A purge gas of the sort described above has at least two advantages. First, the purge gas helps to prevent materials from being deposited on or around the end of the optical fiber. Such deposits are undesirable because they reduce the amount of light entering the optical fiber, and affect the perceived temperature even if the actual temperature has not changed. The purge gas keeps the end of the fiber clean, and allows a more reliable temperature reading.

Second, the purge gas may be used to fine-tune resistivity uniformity by delivering a dopant supply gas to dopant-poor regions of the growing epitaxial layer. As discussed previously, the dopant concentration may be low in certain regions due to, for example, depletion or outgassing mechanisms. To mitigate these effects, a dopant supply gas may be injected through the sheath of an optical pyrometer. An example a particularly effective use of this technique is the injection of a dopant carrier gas through a central optical pyrometer 1303 to compensate for the lack of dopant at the center of the layer that may occur at location 1008 (see FIG. 10B). Thus, the purge gas of an optical pyrometer may, according to embodiments of the present invention, be used to keep the tip of the optical fiber clean, and locally effect the resistivity of the epitaxial layer, among other things.

While the present invention has been described with reference to exemplary embodiments, it will be readily apparent to those skilled in the art that the invention is not limited to the disclosed embodiments but, on the contrary, is intended to cover numerous other modifications, variations and substitutes and broad equivalent arrangements that are included within the spirit and scope of the following claim.

What is claimed is:

1. A wafer processing system comprising:
    a processing chamber containing a substrate holder for receiving at least one semiconductor substrate;
    a heating device in communication with the processing chamber;
    a plurality of gas inlets for flowing gas into the processing chamber over the surface of a semiconductor substrate, wherein at least certain of the gas inlets are configured to flow a gas over an edge zone on a semiconductor substrate, at least certain of the gas inlets are configured to flow a gas over a middle zone on a semiconductor substrate, and at least certain of the gas inlets are configured to flow a gas over a center zone on a semiconductor substrate;
    the plurality of gas inlets include a longitudinal section and a common lateral section that includes a common plenum such that gases flow upwards or downwards through the longitudinal section prior to being directed across the semiconductor substrate by the lateral section;
    a gas supply configured to control flow rate of gases supplied to the gas inlets to selectively control the flow of gases over the edge zone, the middle zone, and the center zone of a semiconductor substrate; and
    a gas exhaust system configured to exhaust gases from the process chamber.

2. A wafer processing system as defined in claim 1, wherein the gas supply is configured to individually control flow rate and concentration of gases supplied to each of the plurality of gas inlets.

3. A wafer processing system as defined in claim 1, wherein the gas exhaust system is configured to control the flow rates of gases being exhausted through a plurality of exhaust ports to selectively control the flow of gases over the edge zone, the middle zone, and the center zone of a semiconductor substrate.

4. A wafer processing system as defined in claim 1, further comprising a second set of gas inlets positioned over the substrate holder.

5. A wafer processing system as defined in claim 1, wherein the processing chamber includes an upper wall, the upper wall defining a recessed portion within the processing chamber for reducing a boundary layer of a gas flowing through the chamber.

6. A wafer processing system as defined in claim 1, further comprising a plurality of temperature measurement devices for monitoring the temperature of a semiconductor substrate contained in the chamber, the temperature measurement devices comprising coaxial cables for also delivering gases to the chamber.

7. A wafer processing system as defined in claim 6, wherein the temperature measurement devices comprise pyrometers.

8. A wafer processing system as defined in claim 1, wherein the heating device comprises a plurality of resistive heaters.

9. A wafer processing system as defined in claim 1, wherein the longitudinal section of the gas inlets are positioned in communication with the heating device for preheating a gas flowing through the gas inlets prior to contacting a semiconductor substrate.

10. A wafer processing system as defined in claim 1, further comprising a wafer rotation device for rotating the substrate holder.

11. A wafer processing system as defined in claim 1, wherein the processing chamber is configured to receive two semiconductor substrates in a side-by-side relationship.

12. A wafer processing system as defined in claim 1, wherein the processing chamber comprises a hot wall process cavity in which at least a top wall and a bottom wall of the process cavity are made from materials that generally have the same heating characteristics as the semiconductor substrate being heated.

13. A wafer processing system comprising:
   a processing chamber containing a substrate holder for receiving a semiconductor substrate, the substrate holder being rotatable;
   a heating device in communication with the processing chamber;
   a plurality of gas inlets for flowing gas into the processing chamber over the surface of a semiconductor substrate, each of the gas inlets including a longitudinal section and the gas inlets having a common lateral section that includes a common plenum, wherein gases flow upwards or downwards through the longitudinal section and are then plenumized by the common plenum as the lateral section directs the gases over the surface of a semiconductor substrate; and
   a gas exhaust system configured to exhaust gases from the process chamber.

14. A wafer processing system as defined in claim 13, wherein common plenum is formed by a gas inject support ring.

15. A wafer processing system as defined in claim 14, wherein the gas inject support ring is arc-shaped.

16. A wafer processing system as defined in claim 13, wherein the longitudinal section of the gas inlets are positioned in communication with the heating device for preheating a gas flowing through the gas inlets prior to contacting a semiconductor substrate.

17. A wafer processing system as defined in claim 16, wherein the longitudinal sections of the gas inlets are made from a quartz.

18. A wafer processing system as defined in claim 16, wherein the longitudinal sections of the gas inlets are made from a silicon carbide.

19. A wafer processing system as defined in claim 13, wherein the system includes at least five gas inlets.

20. A wafer processing system as defined in claim 13, wherein the gas exhaust system includes a pump for pumping exhaust gases from the process chamber.

21. A wafer processing system as defined in claim 13, further comprising a gas supply configured to individually control flow rate and concentration of gases supplied to each of the plurality of gas inlets to selectively control the flow of gases over an edge zone, a middle zone, and a center zone of a semiconductor substrate contained within the chamber.

22. A wafer processing system as defined in claim 13, wherein the lateral section of each of the plurality of gas inlets extend from the bottom of the processing chamber.

23. A wafer processing system as defined in claim 13, wherein the lateral section of each of the plurality of gas inlets extend from the top of the processing chamber.

* * * * *